United States Patent
Kim et al.

(10) Patent No.: US 8,363,186 B2
(45) Date of Patent: Jan. 29, 2013

(54) THIN FILM TRANSISTOR ARRAY PANEL AND LIQUID CRYSTAL DISPLAY INCLUDING THE SAME

(75) Inventors: Jin-Seuk Kim, Daejeon (KR); Young-Je Cho, Cheonan-si (KR); Chul Huh, Yongin-si (KR); Yong-Jo Kim, Asan-si (KR); Sung-Hoon Kim, Seoul (KR); Yui-Ku Lee, Asan-si (KR); Chang-Soon Jang, Seoul (KR)

(73) Assignee: Samsung Display Co., Ltd. (KR)

( * ) Notice: Subject to any disclaimer, the term of this patent is extended or adjusted under 35 U.S.C. 154(b) by 266 days.

(21) Appl. No.: 12/783,356

(22) Filed: May 19, 2010

(65) Prior Publication Data

US 2011/0109852 A1 May 12, 2011

(30) Foreign Application Priority Data

Nov. 12, 2009 (KR) ........................ 10-2009-0109093

(51) Int. Cl.
*G02F 1/1335* (2006.01)
(52) U.S. Cl. ........................................................ 349/106
(58) Field of Classification Search .................. 349/106
See application file for complete search history.

(56) References Cited

U.S. PATENT DOCUMENTS

| | | | | |
|---|---|---|---|---|
| 6,118,505 A * | 9/2000 | Nagata et al. | ................. | 349/106 |
| 6,717,632 B2 | 4/2004 | Ha et al. | | |
| 2004/0239838 A1 | 12/2004 | Lai | | |
| 2005/0157226 A1 | 7/2005 | Lan | | |
| 2005/0219442 A1 | 10/2005 | Yang et al. | | |

FOREIGN PATENT DOCUMENTS

| | | |
|---|---|---|
| JP | 2000-231123 A | 8/2000 |
| JP | 2001-056467 A | 2/2001 |
| JP | 2004-318063 A | 11/2004 |
| JP | 2004-334226 A | 11/2004 |
| JP | 2005-284291 A | 10/2005 |
| JP | 2008-052255 A | 3/2008 |
| JP | 2008-076702 A | 4/2008 |
| KR | 1020010046651 A | 6/2001 |
| KR | 1020040050771 A | 6/2004 |
| KR | 1020040061950 A | 7/2004 |
| KR | 1020040080778 A | 9/2004 |
| KR | 1020040090116 A | 10/2004 |
| KR | 1020050003498 A | 6/2005 |
| KR | 1020050113850 A | 12/2005 |

(Continued)

*Primary Examiner* — James Dudek
(74) *Attorney, Agent, or Firm* — Innovation Counsel LLP

(57) ABSTRACT

A thin film transistor includes: a substrate; a thin film transistor formed on the substrate; a first color filter and a second color filter formed on the thin film transistor and each having a through hole; a capping layer formed on the first color filter and the second color filter; and a pixel electrode formed on the capping layer and connected to the thin film transistor through the through hole, wherein the capping layer formed on the first color filter has a first opening exposing the through hole of the first color filter, the size of the first opening is larger than the size of the through hole, the capping layer formed on the second color filter has a second opening disposed inside the through hole of the second color filter, and the size of the second opening is smaller than the size of the through hole. Accordingly, the capping layer completely covers the green color filter which prevents damage to the green color filter in a dry etching process, and also prevents changes of a color coordinate.

26 Claims, 15 Drawing Sheets

FOREIGN PATENT DOCUMENTS

| | | |
|---|---|---|
| KR | 1020060000279 A | 1/2006 |
| KR | 1020060078578 A | 7/2006 |
| KR | 100626347 B1 | 9/2006 |
| KR | 100766494 B1 | 10/2007 |
| KR | 1020080026404 A | 3/2008 |
| KR | 1020080082086 A | 9/2008 |

* cited by examiner

THIN FILM TRANSISTOR ARRAY PANEL AND LIQUID CRYSTAL DISPLAY INCLUDING THE SAME

CROSS-REFERENCE TO RELATED APPLICATION

This application claims priority to and the benefit of Korean Patent Application No. 10-2009-0109093 filed in the Korean Intellectual Property Office on Nov. 12, 2009, the entire contents of which are incorporated herein by reference.

BACKGROUND OF THE INVENTION (a) Field of the Invention

The present invention relates to a thin film transistor array panel and a liquid crystal display including the same.

(b) Description of the Related Art

A flat panel display is a display device in which the depth of the display is relatively thin as compared with the size of the screen. Liquid crystal displays (LCD), plasma display panels (PDP), and organic light emitting devices (OLED) are types of widely used flat panel displays.

The LCD is a display device that utilizes electro-optical characteristics of liquid crystals. In an LCD, the amount of light transmitted through the liquid crystal is varied according to the intensity of an applied electric field and thereby images are displayed. The PDP is a display device in which plasma generated by gas discharge is used to display images. In the OLED, electrons and holes are injected into an organic illumination layer respectively from a cathode (the electron injection electrode) and an anode (the hole injection electrode). The injected electrons and holes are combined to generate excitons, which illuminate when converting from an excited state to a ground state, and thereby display an image.

A structure of a flat panel display in which the thin film transistor and the color filter are formed on the same substrate is referred to as "color filter on array" (COA), and a capping layer is generally formed on the color filter in the COA structure. The capping layer prevents the color filter from lifting or separating from the substrate. Generally, the color filter is made of an organic layer that has some degree of elasticity. The capping layer, however, is made of an inorganic layer and has small elasticity and compression compared with the color filter of the organic layer. Accordingly, when forming the solid capping layer on the smooth color filter, significant stress is generated in the capping layer.

Also, gasses such as $H_2$ and $N_2$ may not discharge to the outside of the device, and thus remain between the capping layer and the color filter. When such gasses collect between the capping layer and the color filter, cracks may be easily generated near a contact hole for connecting the thin film transistor and the pixel electrode. Such cracks are usually a result of applied heat or an impact to the device. When such cracks occur after the device has been filled with the liquid crystal layer, the gas may outflow through cracks into the liquid crystal layer, and then bubbles are generated such that an active unfilled area (AUA) defect appears. Such an AUA defect can cause light leakage.

The above information disclosed in this Background section is only for enhancement of understanding of the background of the invention and therefore it may contain information that does not form the prior art that is already known to a person of ordinary skill in the art.

SUMMARY OF THE INVENTION

The present invention removes stress of the capping layer to prevent defects in the AUA t and changes of a color coordinate with the passage of time.

In one aspect, a thin film transistor array panel includes: a substrate; a thin film transistor formed on the substrate; a first color filter and a second color filter formed on the thin film transistor and each having a through hole; a capping layer formed on the first color filter and the second color filter; and a pixel electrode formed on the capping layer and connected to the thin film transistor through the through hole, wherein the capping layer formed on the first color filter has a first opening exposing the through hole of the first color filter, the size of the first opening is larger than the size of the through hole, the capping layer formed on the second color filter has a second opening disposed inside the through hole of the second color filter, and the size of the second opening is smaller than the size of the through hole.

The first color filter may include a red color filter and a blue color filter, and the second color filter may include a green color filter.

The first opening of the capping layer formed on the red color filter and the blue color filter may expose the red color filter and the blue color filter near the through hole.

The second opening of the capping layer formed on the green color filter may be smaller than the first opening of the capping layer formed on the red color filter and the blue color filter.

The first opening of the capping layer formed on the red color filter and the blue color filter may overlap a cutout formed in the pixel electrode.

In another aspect, a liquid crystal display includes: a thin film transistor, a color filter formed on the thin film transistor and having a through hole; a capping layer formed on the color filter; a pixel electrode formed on the capping layer and connected to the thin film transistor through the through hole; a common electrode facing the pixel electrode; and a liquid crystal layer interposed between the pixel electrode and the common electrode, wherein the color filter includes a red color filter, a green color filter, and a blue color filter, a first opening of the capping layer formed on the red color filter and the blue color filter encloses a through hole of the red color filter and the blue color filter, and a second opening of the capping layer formed on the green color filter is formed inside a through hole of the green color filter.

The central part of the first opening of the capping layer formed on the red color filter and the blue color filter may correspond to a central part of a cutout of the common electrode.

In another aspect, a thin film transistor array panel includes: a substrate; a thin film transistor formed on the substrate; a first color filter and a second color filter formed on the thin film transistor and each having a through hole; a capping layer formed on the first color filter and the second color filter and having an opening; and a pixel electrode formed on the capping layer and connected to the thin film transistor through the through hole, wherein the capping layer exposes the portion of the first color filter near the opening, the capping layer completely covers the second color filter, and a combination of first color filters and second color filters are disposed on the substrate.

The first color filter may include a red color filter and a blue color filter, and the second color filter may include a green color filter.

The capping layer formed on the red color filter and blue color filter may have a first opening larger than the through hole, and the capping layer formed on the green color filter may cover the green color filter near the through hole of the green color filter and have a second opening disposed inside the through hole of the green color filter.

The first color filter may include a red color filter, a green color filter, and a blue color filter, and the second color filter may include a green color filter.

A ration of an exposed area of the green color filter exposed through the first opening of the capping layer formed on the green color filter to the entire area of the red color filter, the green color filter, and the blue color filter may have a range of 0.001:1 to 0.003:1.

The pixel electrode may include a first sub-pixel electrode and a second sub-pixel electrode separated from each other via a gap interposed therebetween, and the voltage of the first sub-pixel electrode may be higher than the voltage of the second sub-pixel electrode.

The capping layer corresponding to the first sub-pixel electrode may cover the color filter near the through hole, and have a second opening positioned inside the through hole of the color filter, and the capping layer corresponding to the second sub-pixel electrode may have a first opening larger than the through hole of the color filter.

The thin film transistor may be connected to the pixel electrode through an end portion of the drain electrode, and the end portion of the drain electrode of the thin film transistor contacted with the pixel electrode through the second opening may be smaller than the end portion of the drain electrode of the thin film transistor contacted with the pixel electrode through the first opening.

A ration of an expose area of the green color filter exposed through the first opening of the capping layer formed on the green color filter, to the entire area of the red color filter, the green color filter, and the blue color filter may have a range of 0.001:1 to 0.003:1.

In another aspect thin film transistor array panel includes a substrate, and a plurality of dots formed on the substrate and each dot including a red pixel, a green pixel, and a blue pixel, wherein the red pixel, the green pixel, and the blue pixel respectively include: a thin film transistor formed on the substrate; a red color filter, a green color filter, and a blue color filter formed on the thin film transistor and having a through hole; a capping layer formed on the red color filter, the green color filter, and the blue color filter and having an opening; and a pixel electrode formed on the capping layer and connected to the thin film transistor through the through hole, wherein the plurality of dots includes a first dot where the capping layer exposes the portion of the red color filter and the blue color filter and completely covers the green color filter, and a second dot where the capping layer exposes the portion of the red color filter, the blue color filter, and the green color filter, and a combination of first dots and second dots are disposed on the substrate.

The capping layer formed on the red color filter and the blue color filter of the first dot has a first opening exposing the through hole of the red color filter and the blue color filter, and the size of the first opening is larger than the size of the through hole.

The capping layer formed on the green color filter of the first dot may cover the green color filter near the through hole of the green color filter, and has a second opening disposed inside the through hole of the green color filter, the capping layer formed on the red color filter, the green color filter, and the blue color filter of the second dot may have a first opening exposing the through hole of the red color filter, the green color filter, and the blue color filter, and the size of the first opening is larger than the size of the through hole.

The first dot and the second dot may be disposed on the substrate with a ratio of 3:1 to 10:1.

A ratio of an exposed area of the green color filter exposed through the first opening of the capping layer formed on the green color filter to the entire area of the red color filter, the green color filter, and the blue color filter has a range of 0.001:1 to 0.003:1.

The dot may further include a third dot where the capping layer completely covers the red color filter, the blue color filter, and the green color filter, and a combination of first dots, the second dots, and the third dots are disposed on the substrate.

The capping layer formed on the red color filter and the blue color filter of the first dot may have a first opening exposing the through hole of the red color filter and the blue color filter, the size of the first opening may be larger than the size of the through hole, the capping layer formed on the green color filter of the first dot may cover the green color filter near the through hole of the green color filter and may have a second opening disposed inside the through hole of the green color filter, the capping layer formed on the red color filter, the green color filter, and the blue color filter of the second dot have a first opening exposing the through hole of the red color filter, the green color filter, and the blue color filter, the size of the first opening may be larger than the size of the through hole, and the capping layer formed on the red color filter, the green color filter, and the blue color filter of the third dot may cover the red color filter, the green color filter, and the blue color filter near the through hole of the red color filter, the green color filter, and the blue color filter and may have a second opening disposed inside the through hole of the red color filter, the green color filter, and the blue color filter.

A ratio of an exposed area of the green color filter exposed through the first opening of the capping layer formed on the green color filter, to the entire area of the red color filter, the green color filter, and the blue color filter, may have a range of 0.001:1 to 0.003:1.

The pixel electrode may include a first sub-pixel electrode and a second sub-pixel electrode separated from each other via a gap interposed therebetween, and the voltage of the first sub-pixel electrode may be higher than the voltage of the second sub-pixel electrode.

The capping layer corresponding the first sub-pixel electrode may cover the color filter near the through hole and has a second opening disposed inside the through hole of the color filter, and the capping layer corresponding to the second sub-pixel electrode may have a first opening larger than the through hole of the color filter.

The thin film transistor may be contacted with the pixel electrode through the drain electrode, and the end portion of the drain electrode of the thin film transistor contacted with the pixel electrode through the second opening may be smaller than the end portion of the drain electrode of the thin film transistor contacted with the pixel electrode through the first opening.

A ratio of an exposed area of the green color filter exposed through the first opening of the capping layer formed on the green color filter, to the entire area of the red color filter, the green color filter, and the blue color filter, has a range of 0.001:1 to 0.003:1.

In one aspect, the solid capping layer has the opening exposing the red color filter and the blue color filter such that stress generated in the red color filter and the blue color filter by the capping layer may be reduced, and separation of the capping layer at the interface between the capping layer and the color filter is prevented, thereby preventing the AUA deterioration.

The capping layer completely covers the green color filter, and the opening of the capping layer formed on the green color filter is formed inside the through hole of the green color filter such that the damage of the green color filter in the dry etching process forming the opening in the capping layer formed on the red color filter and the blue color filter may be prevented. Accordingly, changing of the color coordinate of the liquid crystal display by damage to the green color filter according to the passage of time may be prevented.

Also, the first dot where the capping layer exposes the portion of the red color filter and the blue color filter and completely covers the green color filter, and the second dot where the capping layer exposes the portion of the red color filter, the blue color filter, and the green color filter are intermixed such that the AUA deterioration may be prevented, and simultaneously the change of the color coordinate of the liquid crystal display according to the passage of the time may be prevented.

DETAILED DESCRIPTION OF THE EMBODIMENTS

Figure 1:
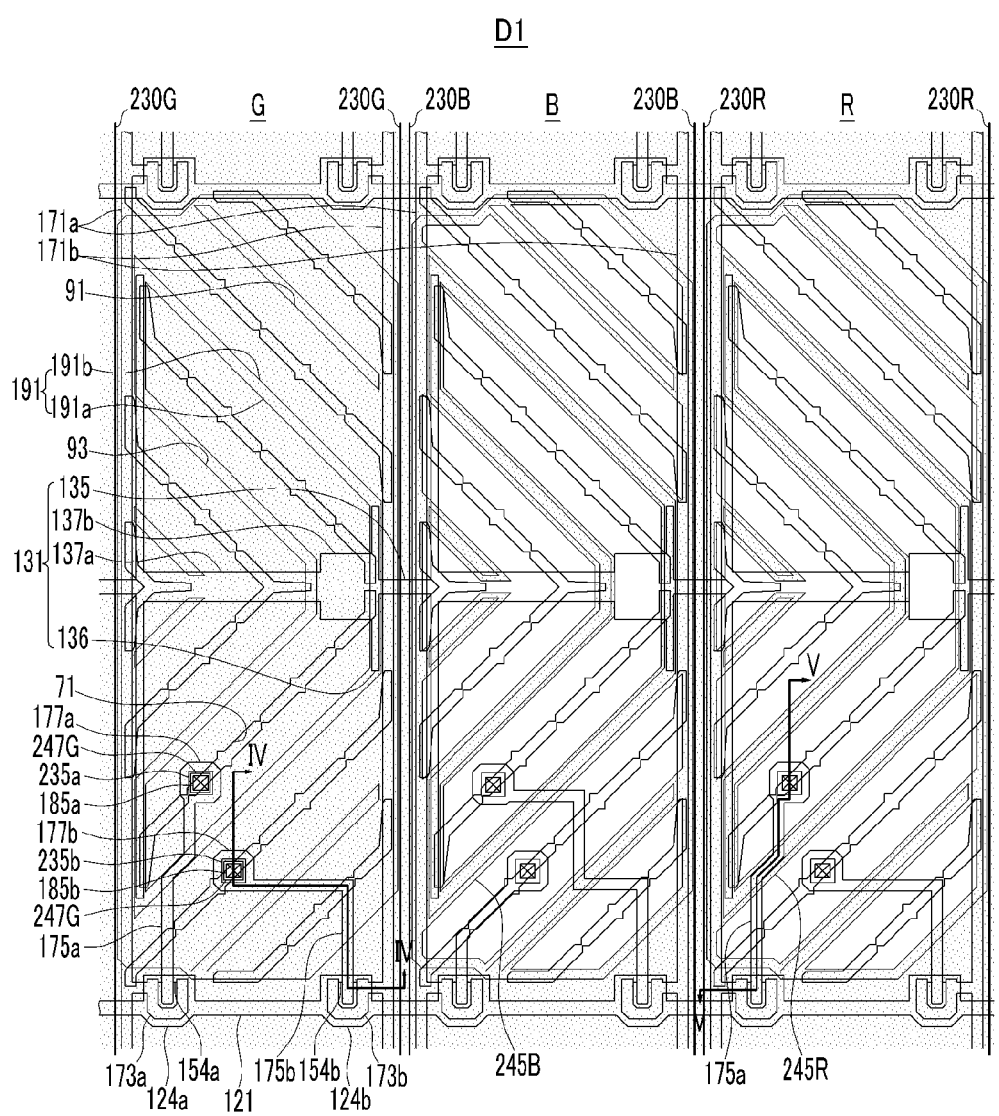
FIG. 1 is a layout view of a liquid crystal display including a thin film transistor array panel according to the first exemplary embodiment.

The present invention will be described more fully hereinafter with reference to the accompanying drawings, in which exemplary embodiments are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element, or intervening elements may also be present. In contrast, when an element is referred to as being "directly on" another element, there are no intervening elements present.

A thin film transistor array panel according to an exemplary embodiment will described with reference to FIG. 1 to FIG. 5. In FIG. 1 to FIG. 5, only a liquid crystal display is described, however a film transistor array panel according to the present exemplary embodiment may be used in various other types of display devices.

Figure 2:
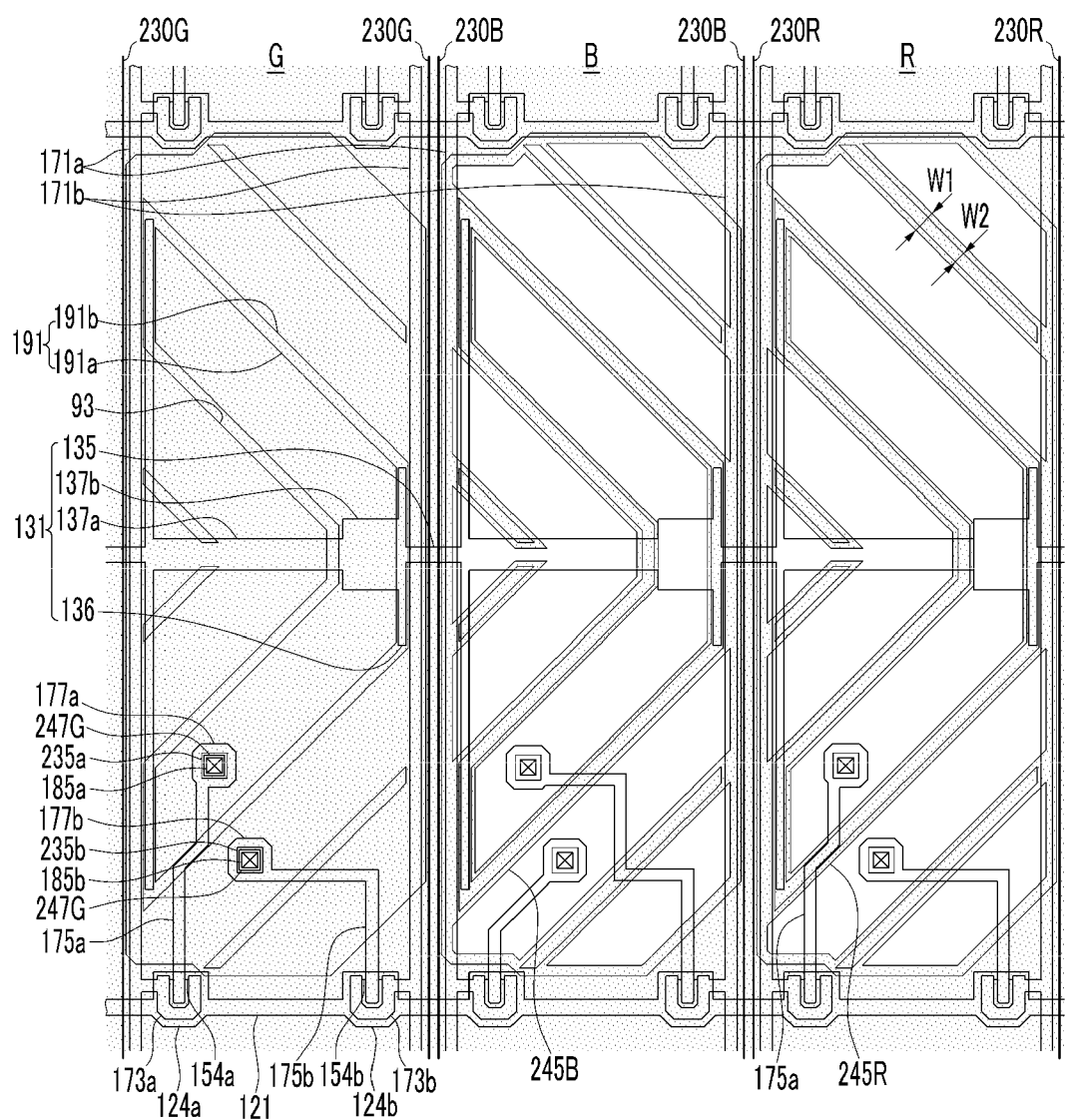
FIG. 2 is a layout view of the thin film transistor array panel shown in FIG. 1.
Figure 3:
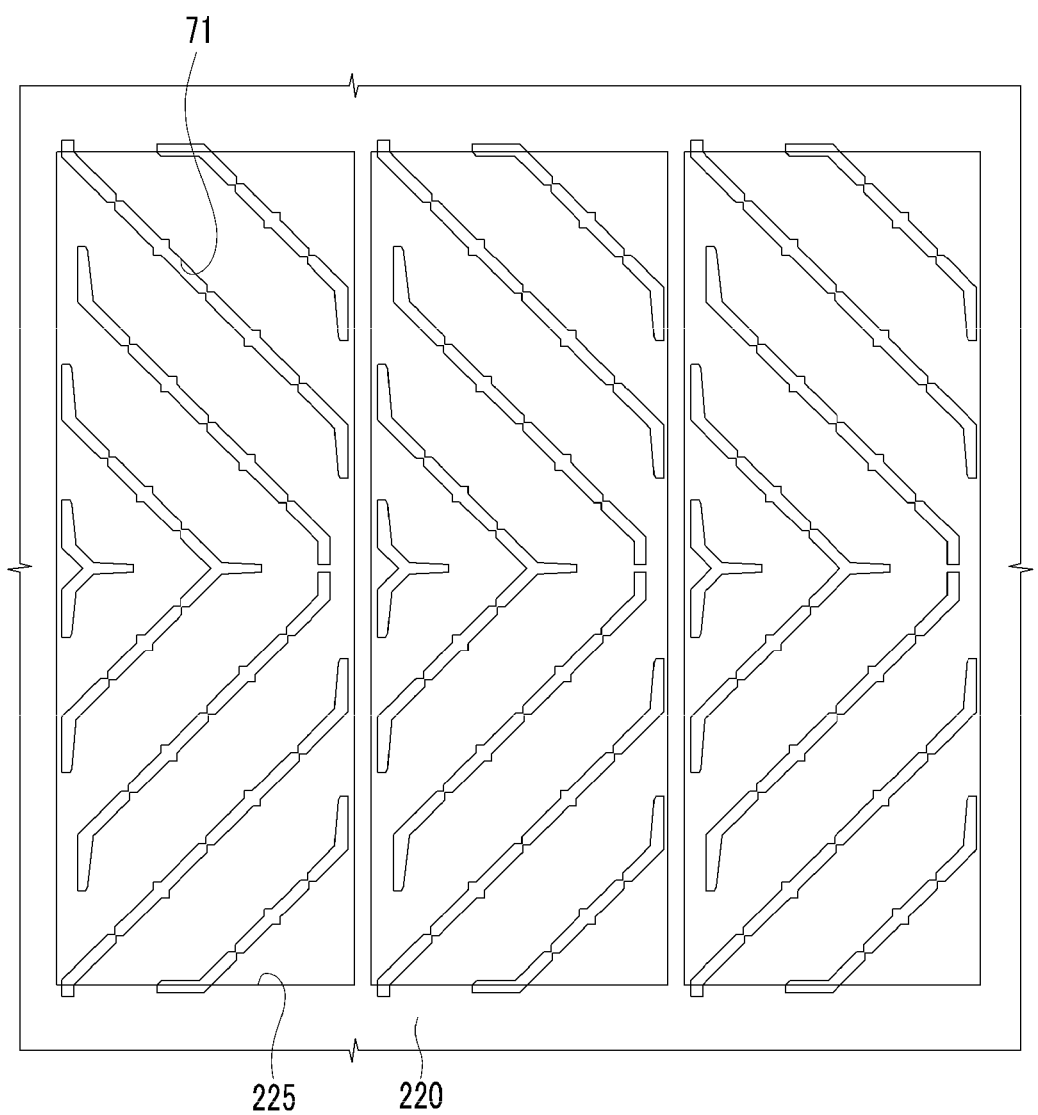
FIG. 3 is a layout view of the common electrode panel shown in FIG. 1.
Figure 4:
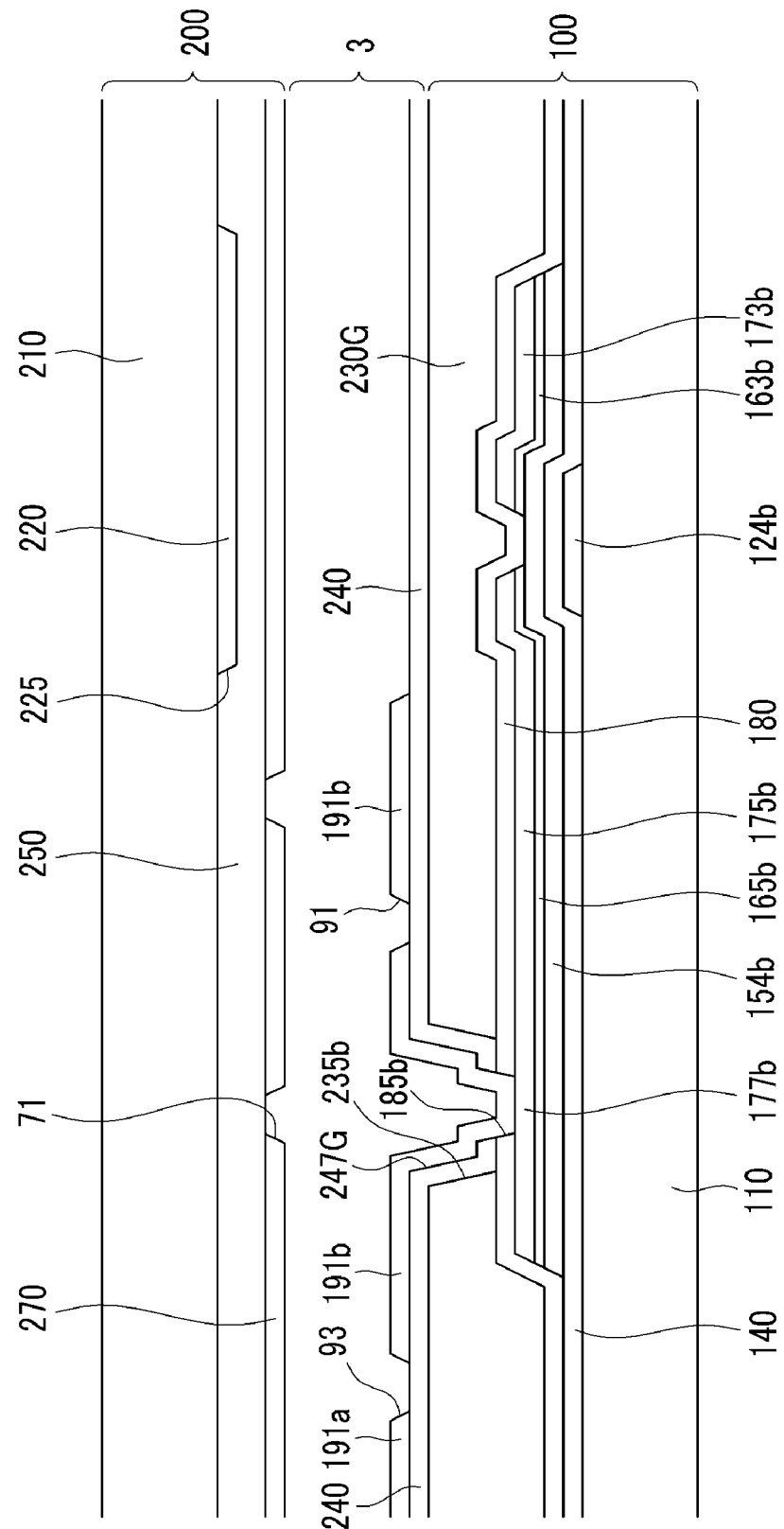
FIG. 4 is a cross-sectional view of the liquid crystal display shown in FIG. 1 taken along the line IV-IV.
Figure 5:
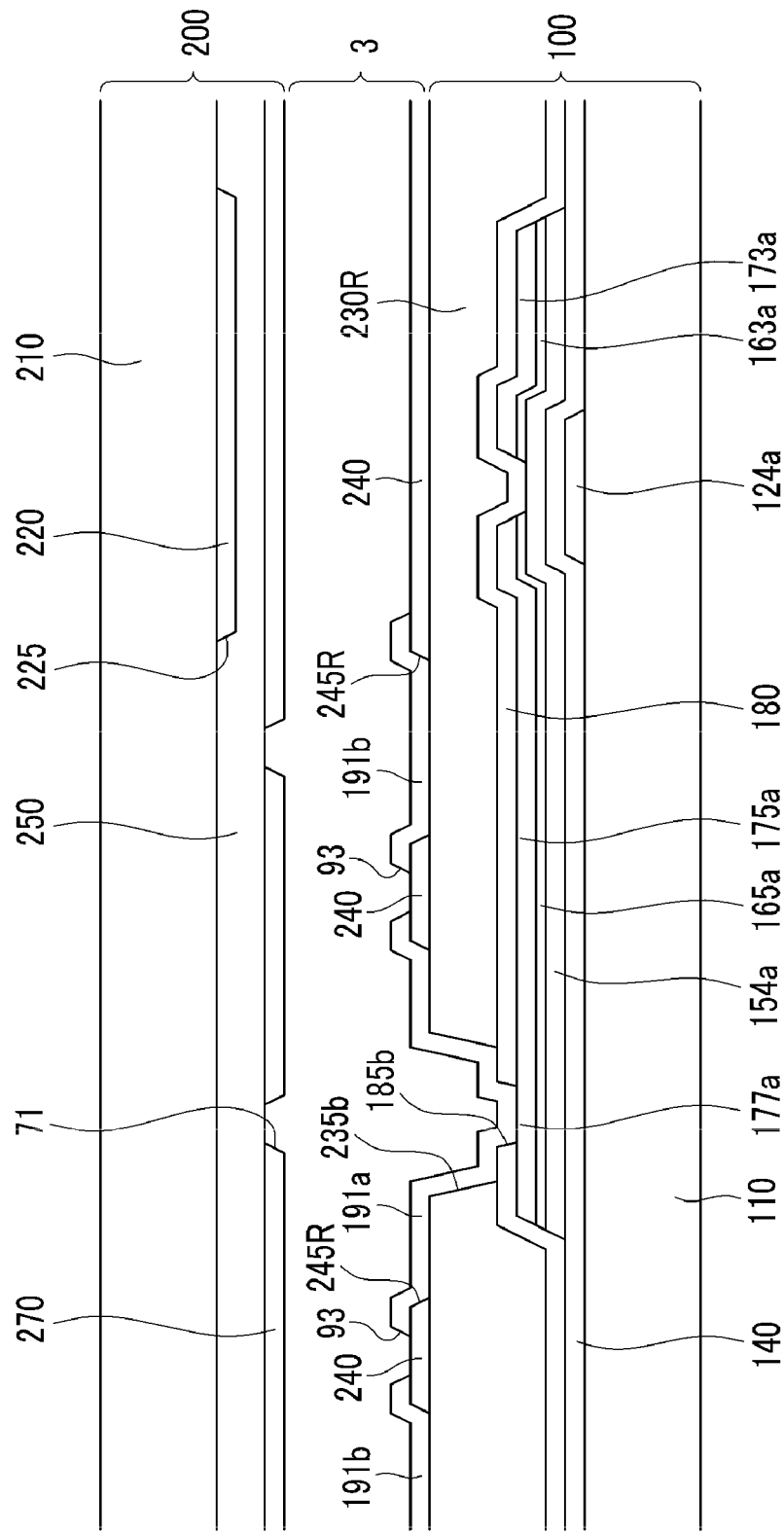
FIG. 5 is a cross-sectional view of the liquid crystal display shown in FIG. 1 taken along the line V-V.

FIG. 1 is a layout view of a liquid crystal display including a thin film transistor array panel according to the first exemplary embodiment, FIG. 2 is a layout view of the thin film transistor array panel shown in FIG. 1, FIG. 3 is a layout view of the common electrode panel shown in FIG. 1, FIG. 4 is a cross-sectional view of the liquid crystal display shown in FIG. 1 taken along the line IV-IV, and FIG. 5 is a cross-sectional view of the liquid crystal display shown in FIG. 1 taken along the line V-V.

As shown in FIG. 1 to FIG. 5, a liquid crystal display includes a thin film transistor array panel 100 and a common electrode panel 200 that face each other (FIGS. 4 and 5), and a liquid crystal layer 3 interposed between the two display panels 100 and 200.

The liquid crystal layer 3 has negative dielectric anisotropy. When an electric field is not being applied to liquid crystal layer 3, liquid crystal molecules of the liquid crystal layer 3 are aligned such that their major axes are perpendicular to the surfaces of the two display panels.

Alignment layers (not shown) may be formed on the inner surfaces of the display panels 100 and 200, and they may be vertical alignment layers. Polarizers (not shown) may be provided on the outer surfaces of the display panels 100 and 200.

First, the common electrode panel 200 will be described.

A light blocking member 220 is formed on an insulation substrate 210, which is made of transparent glass or plastic. The light blocking member 220 has an opening 225 that faces a pixel electrode 191. Light blocking member 220 blocks light leakage that may occur between the pixel electrodes 191. An insulating layer 250 that provides a flat surface is formed on the light blocking member 220. The insulating layer 250 may be omitted.

A common electrode 270 is formed on the insulating layer 250. The common electrode 270 is made of a transparent conductor such as ITO or IZO, and receives a common voltage. The common electrode 270 includes a plurality of cutouts 71 (FIG. 3). Each of the cutouts 71 has at least one slanting portion that extends in a substantially obliquely inclined direction with respect to a gate line 121, and each slanting portion has a plurality of notches that are concave or convex.

Next, the thin film transistor array panel 100 will be described.

A plurality of gate lines 121 and a plurality of storage electrode lines 131 are formed on an insulating substrate 110 that is typically made of transparent glass or plastic.

The gate lines 121 extend in a substantially transverse direction and transmit gate signals. Each gate line 121 includes a plurality of first and second gate electrodes 124a and 124b that protrude upward and downward from the gate line 121.

The storage electrode lines 131 extend in a substantially transverse direction and parallel to the gate lines 121, and are supplied with a predetermined voltage. Each storage electrode line 131 is disposed between two neighboring gate lines 121 and equidistant from (halfway between) the two neighboring gate lines 121. The storage electrode lines 131 include the first and second storage electrodes 137a and 137b, a branch electrode 136, and a connection 135. The first and second storage electrodes 137a and 137b are approximately rectangular and are connected to each other. The horizontal length of the first storage electrode 137a is longer than the horizontal length of the second storage electrode 137b, and the vertical length of the first storage electrode 137a is shorter than the vertical length of the second storage electrode 137b. The branch electrode 136 is connected to the end of the second storage electrode 137b and extends in the longitudinal direction near the gate line 121. The transverse length of branch electrode 136 is relatively short. The connection 135 connects the branch electrode 136 to the neighboring first storage electrode 137a. The vertical length of connection 135 is short compared with the first and second storage electrodes 137a and 137b. However, the shapes and arrangement of the storage electrode lines 131 can be modified in various forms.

A gate insulating layer 140 composed of silicon nitride (SiNx) or silicon oxide (SiOx) is formed on the gate lines 121 and the storage electrode lines 131.

A plurality of first and second semiconductor islands 154a and 154b typically composed of hydrogenated amorphous silicon (simply referred to as a-Si) or polysilicon are formed on the gate insulating layer 140. The first semiconductor island 154a overlaps the first gate electrodes 124a. The second semiconductor island 154b overlaps the second gate electrodes 124b.

A pair of first ohmic contact islands 163a and 165a are formed on the first semiconductor island 154a, and a pair of second ohmic contact islands 163b and 165b are formed on the second semiconductor island 154b. The ohmic contacts 163a, 165a, 163b, and 165b may be composed of a material such as n+ hydrogenated amorphous silicon, in which an n-type impurity is doped with a high concentration, or of silicide.

A plurality of first and second data lines 171a and 171b and a plurality of first and second drain electrodes 175a and 175b are formed on the ohmic contacts 163a and 165a, and 163b and 165b, and on the gate insulating layer 140.

The first and second data lines 171a and 171b transmit data signals, extend substantially in the vertical direction, and cross the gate lines 121 and the connection 135 of the storage electrode lines 131. The first data line 171a includes a first source electrode 173a that extends toward the first gate electrode 124a and is curved with a "U" shape. Likewise, the second data line 171b includes a second source electrode 173b that extends toward the second gate electrode 124b and is curved with a "U" shape.

The drain electrodes 175a and 175b are separated from the data lines 171a and 171b. Each drain electrode 175a and 175b includes one end enclosed by the source electrodes 173a and 173b and the other end having a wide area. The planar shape of the drain electrodes 175a and 175b may be altered in various ways. In FIG. 2, the wide end portion 177a of the first drain electrode 175a disposed in the left pixel is disposed closer to the storage electrode line 131 than the second drain electrode 175b. The wide end portion 177b of the second drain electrode 175b disposed in the adjacent (middle) pixel is disposed closer to the storage electrode line 131 than the first drain electrode 175a. However, the planar shape of the drain electrodes 175a and 175b may be the same in all pixels.

The first gate electrode 124a, the first source electrode 173a, and the first drain electrode 175a form the first thin film transistor along with the first semiconductor 154a. The second gate electrode 124b, the second source electrode 173b, and the second drain electrode 175b form the second thin film transistor along with the second semiconductor 154b. Also, the channel of the first thin film transistor is formed in the first semiconductor 154a between the first source electrode 173a and the first drain electrode 175a. The channel of the second thin film transistor is formed in the second semiconductor 154b between the second source electrode 173b and the second drain electrode 175b.

The ohmic contacts 163b and 165b only exist between the semiconductors 154a and 154b, which are above, and the data lines 171a and 171b and drain electrodes 175a and 175b, which are underneath, and reduce contact resistance between them. The semiconductors 154a and 154b have portions that are exposed without being covered by the data lines 171a and 171b and the drain electrodes 175a and 175b, including a region between the source electrodes 173a and 173b and drain electrodes 175a and 175b.

A passivation layer 180 is formed on the source electrodes 173a and 173b, the drain electrodes 175a and 175b, and the exposed semiconductors 154a and 154b. The passivation layer 180 may be made of an inorganic insulator such as silicon nitride or silicon oxide. However, the passivation layer 180 may be omitted.

The passivation layer 180 has contact holes 185a and 185b respectively that expose the wide end portions 177a and 177b of the drain electrodes 175a and 175b.

Color filters 230R, 230G, and 230B are formed on the passivation layer 180. The color filters 230R, 230G, and 230B include a red color filter 230R, a green color filter 230G, and a blue color filter 230B, and may be made of a photosensitive organic material that includes pigments. The color filters 230R, 230G, and 230B may be elongated in a vertical direction along the data lines 171a and 171b to form a stripe.

The boundary of two neighboring color filters 230 may be disposed between two nearest data lines 171a and 171b such that the two color filters 230 overlap each other to serve as a light blocking member that blocks light that leaks from between the pixel electrodes 191.

The color filters 230 have through holes 235a and 235b through which the contact holes 185a and 185b pass. The through holes 235a and 235b are larger than the contact holes 185a and 185b.

A capping layer 240 preferably made of an inorganic insulator such as silicon nitride or silicon oxide is formed on the color filters 230R, 230G, and 230B.

The capping layer 240 has first openings 245R and 245B disposed in the red color filter 230R and the blue color filter 230B, respectively, which expose, respectively, a portion of the red color filter 230R and the blue color filter 230B.

In more detail, the capping layer 240 formed on the red color filter 230R and the blue color filter 230B includes a straight portion that overlaps the gate lines 121 and the data lines 171a and 171b, and an oblique portion that forms an angle of about 45 degrees with the gate lines 121. The capping layer 240 formed on the red color filter 230R and the blue color filter 230B includes first openings 245R and 245B, respectively, between the neighboring oblique portions and first openings 245R and 245B that expose the through holes 235a and 235b of the red color filter 230R and the blue color filter 230B. Accordingly, the boundaries of the first openings 245R and 245B are disposed outside of the through holes 235a and 235b.

The first openings 245R and 245B of the capping layer 240 formed corresponding to the red color filter 230R and the blue color filter 230B enclose the through holes 235a and 235b of the red color filter 230R and the blue color filter 230B, respectively, such that the first openings 245R and 245B of the capping layer 240 are larger than the through holes 235a and 235b of the red color filters 230R and the blue color filter 230B.

On the other hand, the capping layer 240 formed corresponding to the green color filter 230G completely covers, with the exception of the noted opening, the green color filter 230G. The capping layer 240 on the green color filter 230G has a second opening 247G inside the through holes 235a and 235b of the green color filter 230G. It is preferable that the second opening 247G of the capping layer 240 formed corresponding to the green color filter 230G is substantially equal to or greater than the size of the contact holes 185a and 185b of the passivation layer 180.

The second opening 247G of the capping layer 240 formed corresponding to the green color filter 230G is typically smaller than the first openings 245R and 245B of the capping layer 240 formed corresponding to the red color filter 230R and the blue color filter 230B.

A pixel electrode 191 is formed on the capping layer 240. The pixel electrode 191 may be made of a transparent conductive material such as ITO or IZO, or a reflective metal such as aluminum, silver, chromium, or alloys thereof.

The pixel electrode 191 includes a first sub-pixel electrode 191a and a second sub-pixel electrode 191b that is larger than the first sub-pixel electrode 191a. The first sub-pixel electrode 191a has a band shape that forms an acute angle having a vertex that is approximately on a line (imaginary) that traverses the center of the pixel (i.e., along storage electrode line 131). First sub-pixel electrode 191a is enclosed by the second sub-pixel electrode 191b via a gap 93 interposed therebetween. The second sub-pixel electrode 191b has a plurality of cutouts 91 with a straight band shape, and the cutouts 91 form an angle of about 45 degrees with the gate lines 121 and the data lines 171a and 171b. The gap 93 includes a plurality of oblique portions substantially parallel to the cutouts 91, and a plurality of longitudinal portions substantially parallel to the data lines 171a and 171b The first sub-pixel electrode 191a and the second sub-pixel electrode 191b receive separate data voltages through the different data lines 171a and 171b, and the voltage of the first sub-pixel electrode 191a having a relatively small area is higher than the voltage of the second sub-pixel electrode 191b having a relatively large area.

In this way, when the first and second sub-pixel electrodes 191a and 191b differ in voltage from each other, the liquid crystal capacitor formed between the first sub-pixel electrode 191a and the common electrode 270 and the liquid crystal capacitor formed between the second sub-pixel electrode 191b and the common electrode 270 involve different voltages. As a result of the different voltages, the liquid crystal molecules at the respective sub-pixels differ in inclination angle from each other, and accordingly, the two sub-pixels are differentiated in luminance from each other. Therefore, when the voltages of the liquid crystal capacitors are properly controlled, the image viewed from the lateral side of the display most closely approximates the image viewed from the frontal side of the display. In other words, the lateral gamma curve maximally approximates the frontal gamma curve. In this way, the lateral visibility of the display can be enhanced.

The cutouts 91 and the gap 93 of the second pixel electrode 191b overlap the oblique portion of the capping layer 240 formed on the red color filter 230R (FIG. 5) and the blue color filter 230B and are alternately arranged with the cutouts 71 of the common electrode 270. The capping layer 240 formed on the red color filter 230R and the blue color filter 230B along with the first sub-pixel electrode 191a and the second sub-pixel electrode 191b coverall of the color filters 230R and 230B. The capping layer 240 formed on just the green color filter 230G covers all the green color filter 230G (FIG. 4).

The first and second subpixel electrodes 191a and 191b have approximately the same shape as the first openings 245R and 245B of the capping layer 240 that is formed on the red color filter 230R and the blue color filter 230B, and the majority thereof is disposed in the first openings 245R and 245B. The width W1 (FIG. 2) of the oblique portion of the capping layer 240 formed on the red color filter 230R and the blue color filter 230B is wider than the width W2 of the cutout 91 such that the edges of the first and second subpixel electrodes 191a and 191b overlap the edge of the capping layer 240 (FIG. 5). However, the first and second subpixel electrodes 191a and 191b may also be formed so as to not overlap the capping layer 240 formed on the red color filter 230R and the blue color filter 230B, and the width W1 of the oblique portion of the capping layer 240 may be substantially the same as the width W2 of the cutout 91.

If the first openings 245R and 245B formed in the capping layer 240 on, respectively, the red color filter 230R and the blue color filter 230B, the stress generated by the capping layer 240 may be reduced. Furthermore gas, such as $H_2$ and $N_2$ remaining at the interface between the capping layer 240 and the color filter 230 after processing, is discharged, which may prevent the interface between the capping layer 240 and the color filter 230 from separating (lifting). As a result, deterioration of the AUA may be prevented.

Also, the capping layer 240 covers all the green color filter 230B, and the second opening 247G of the capping layer 240 formed on the green color filter 230G is formed inside the through holes 235a and 235b of the green color filter 230G. As a result, damage to the green color filter 230G that can occur in the dry etching process used to form the first opening 245R and 245B at the capping layer 240 formed on the red color filter 230R and the blue color filter 230B may be prevented.

When copper compounds or nickel compounds that are used as the pigments of the green color filter 230G are exposed in the dry etching process, copper or nickel is not removed and as a result, residues are created. These residues accumulate around the through holes and react with the liquid crystal causing a deformation in the alignment layers. Accordingly, with passage of time, the transmittance deteriorates at a low gray level, that is a gray level of under 25, such that the color coordinate is changed.

Accordingly, in an exemplary embodiment of the present invention, the capping layer 240 covers all the green color filter 230G so that the damage to the green color filter 230G may be prevented in the dry etching process, and thereby the change of the color coordinate may be prevented.

Also, the capping layer 240 and the pixel electrode 191 cover the whole color filter 230. As a result, of the coverage, separation of the color filter 230 layer may be prevented and contamination of the liquid crystal layer 3 by an organic material such as a solvent that flows in from the color filter 230 may be suppressed. Therefore, problems such as an afterimage that may be generated under driving may be prevented.

The first and second subpixel electrodes 191a and 191b are connected to the first and second drain electrodes 175a and 175b through the first openings 245R and 245B, the second opening 247G, and the contact holes 185a and 185b. In FIG. 2, the first subpixel electrode 191a disposed in the left pixel is connected to the first drain electrode 175a disposed in the left side of the subpixel. The first subpixel electrode 191a disposed in the neighboring pixel to the right is connected to the second drain electrode 175b disposed in the right side of that subpixel.

The first and second subpixel electrodes 191a and 191b respectively receive data voltages from the first and second drain electrodes 175a and 175b. Data voltages are applied to the first and second subpixel electrodes 191a and 191b along with the common electrode 270 of the common electrode panel 200 to generate an electric field such that the orientation of the liquid crystal molecules of the liquid crystal layer 3 between the electrodes 191a and 191b and 270 is determined. Accordingly, the luminance of the light transmitted through the liquid crystal layer 3 differs depending on the thusly determined orientation of the liquid crystal molecules.

The first thin film transistor, the first subpixel electrode 191a, and the liquid crystal layer 3, and the common electrode 270 and the polarizer that are disposed on them (not shown), form a unit for displaying one luminance point that is referred to as a first subpixel hereafter. Also, the second thin film transistor, the second subpixel electrode 191b, and the liquid crystal layer 3, and the common electrode 270 and the polarizer that are disposed on them (not shown), form a unit for displaying one luminance point that is referred to as a second subpixel hereafter. The first subpixel and the second subpixel are combined to represent one effective luminance point, and they may be represented as one pixel for this reason. Also, the red pixel R corresponding to the red color filter 230R, the green pixel G corresponding to the green color filter 230G, and the blue pixel B of the blue color filter 230B form one dot, and the combination of red, green, and blue may represent various colors.

The first and second subpixel electrodes 191a and 191b and the common electrode 270 form the first and second capacitors (called liquid crystal capacitors) to maintain the applied voltage across the liquid crystal layer 3 even after the TFT is turned off. The first and second subpixel electrodes 191a and 191b and the storage electrode line 131 form a storage capacitor.

Next, a manufacturing method of a liquid crystal display including a thin film transistor array panel according to an exemplary embodiment will be described with reference to FIG. 1 to FIG. 5.

First, the first and second thin film transistors including the first and second gate electrodes 124a and 124b, the first and second source electrodes 173a and 173b, the first and second drain electrodes 175a and 175b and the first and second semiconductors 154a and 154b are formed on the substrate 110.

Next, the passivation layer 180 and the color filters 230R, 230G, and 230B are deposited on the first and second thin film transistors. Next, the color filters 230R, 230G, and 230B are patterned to form the through holes 235a and 235b.

Next, inorganic material is deposited on the color filters 230R, 230G, and 230B to form the capping layer 240. Next, the capping layer 240 is etched to form the first opening 245R and 245B and the second opening 247G. Here, the first openings 245R and 245B that are larger than the through holes 235a and 235b are in the capping layer 240 formed on the red color filter 230R and the blue color filter 230B near the through holes 235a and 235b of the red color filter 230R and the blue color filter 230B. The second opening 247G is formed in the capping layer 240 that is formed in the green color filter 230G inside the through holes 235a and 235b of the green color filter 230G. When etching the capping layer 240, the passivation layer 180 exposed through the through holes 235a and 235b may be etched to form the contact holes 185a and 185b at the same time.

Next, a pixel electrode 191 connected to the first and second drain electrodes 175a and 175b through the first openings 245R and 245B, and the second opening 247G, the through holes 235a and 235b, and the contact holes 185a and 185b are formed on the capping layer 240.

Next, the common electrode panel 200 that includes the light blocking member 220 and the common electrode 270 is combined with the thin film transistor array panel 100, and liquid crystal molecules are injected between two display panels 100 and 200 to form the liquid crystal layer 3. The liquid crystal layer 3 may be formed before or after the combination of the two display panels 100 and 200.

Now, a thin film transistor array panel according to another exemplary embodiment will described with reference to FIG. 4, FIG. 6, and FIG. 7.

Figure 6:
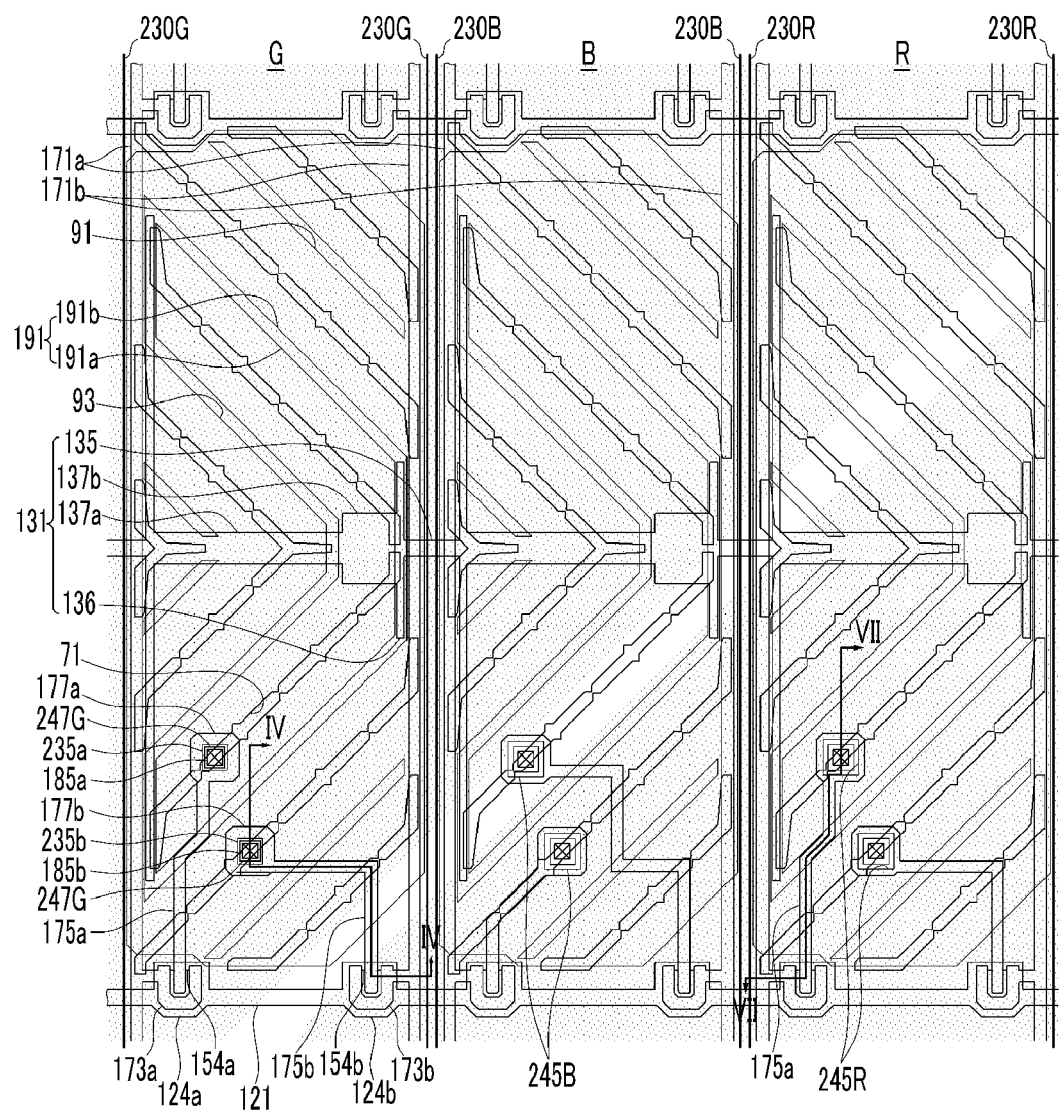
FIG. 6 is a layout view of a liquid crystal display including a thin film transistor array panel according to the second exemplary embodiment.

FIG. 6 is a layout view of a liquid crystal display including a thin film transistor array panel according to another exemplary embodiment. FIG. 7 is a cross-sectional view of the liquid crystal display shown in FIG. 6 taken along the line VII-VII. FIG. 4 is a cross-sectional view of the liquid crystal display shown in FIG. 6 taken along the line IV-IV.

Figure 7:
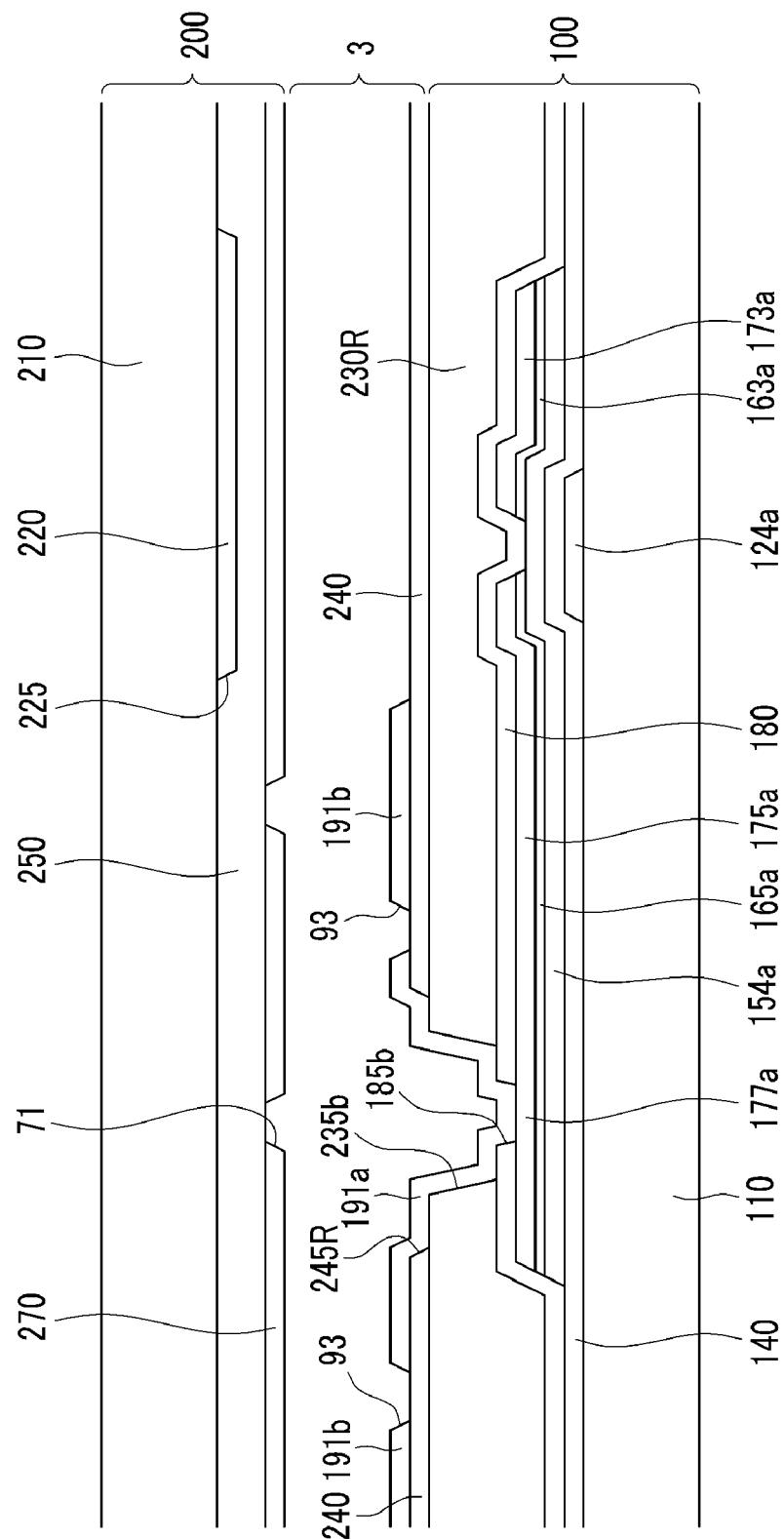
FIG. 7 is a cross-sectional view of the liquid crystal display shown in FIG. 6 taken along the line VII-VII.

Referring to FIG. 4, FIG. 6, and FIG. 7, a liquid crystal display includes a thin film transistor array panel 100 having first and second thin film transistors, color filters 230R, 230G, and 230B, a capping layer 240, and a pixel electrode 191, a common electrode panel 200 having a light blocking member 220 and a common electrode 270, and a liquid crystal layer 3 formed between the display panels 100 and 200.

The structures of the thin film transistor array panel 100, the common electrode panel 200, and the liquid crystal layer 3 are almost the same as the structures of the exemplary embodiment shown in FIG. 1 to FIG. 5.

However, in the capping layer 240 according to the present exemplary embodiment, the first opening 245R near the through holes 235a and 235b of the color filter 230R, is structured differently from the capping layer 240 shown in FIG. 1, FIG. 2, FIG. 4, and FIG. 5 (Compare, for instance, FIG. 5 and FIG. 7).

In the planar view (FIG. 6), the first opening 245R formed near the through holes 235a and 235b has an approximately square shape. The area of the first opening 245R is larger than the area of the through holes 235a and 235b, and may be equal to or less than the area of the wide end portions 177a and 177b of the drain electrodes 175a and 175b.

Many characteristics of the exemplary embodiment shown in FIG. 1 to FIG. 5 may apply to the exemplary embodiment shown in FIG. 6 and FIG. 7.

When the first openings 245R and 245B are formed in the capping layer 240 formed on the red color filter 230R and the blue color filter 230B, respectively, the stress generated by the capping layer 240 may be reduced, and furthermore separation between the capping layer 240 and the color filter 230 that can occur at the interface may be prevented such that the AUA deterioration may be prevented. Also, the capping layer 240 covers all of the green color filter 230G, and the second opening 247G of the capping layer 240 formed on the green color filter 230G is formed inside the through holes 235a and 235b of the green color filter 230G such that the damage to the green color filter 230G may be prevented in the dry etching process used to form the first openings 245R and 245B in the capping layer 240 formed on the red color filter 230R and the blue color filter 230B. As a result, change of the color coordinate with the passage of time may be prevented. Also, the capping layer 240 and the pixel electrode 191 cover the whole color filter 230 such that they may prevent the color filter 230 from separating and may suppress contamination of the liquid crystal layer 3 by an organic material, such as a solvent, that flows in from the color filter 230. Therefore, problems such as an afterimage that may be generated under driving may be prevented.

A manufacturing method of the liquid crystal display according to the exemplary embodiment shown in FIG. 6 and FIG. 7 is almost the same as the manufacturing method of the liquid crystal display according to the exemplary embodiment shown in FIG. 1 to FIG. 5. However, the shape of the first openings 245R and 245B of the capping layer 240 formed on the red color filter 230R and the blue color filter 230B is different.

On the other hand, in the exemplary embodiment shown in FIGS. 1 to 5, the capping layer 240 formed at the position corresponding to the red color filter 230R and the blue color filter 230B in one dot exposes the portion of the red color filter 230R and the blue color filter 230B through the first openings 245R and 245B, respectively, and the capping layer 240 formed at the position corresponding to the green color filter 230G completely covers the green color filter 230G.

All dots may have this structure, however the first dot D1 having the structure in which the capping layer 240 exposes the portion of the red color filter 230R and the blue color filter 230B and completely covers the green color filter 230G, and the second dot D2 having the structure in which the capping layer 240 exposes the portion of the red color filter 230R, the blue color filter 230B, and the green color filter 230G, may be mixed.

Next, a liquid crystal display having a mixed arrangement of the first dot and the second dot will be described with reference to FIG. 8 and FIG. 9.

Figure 8:
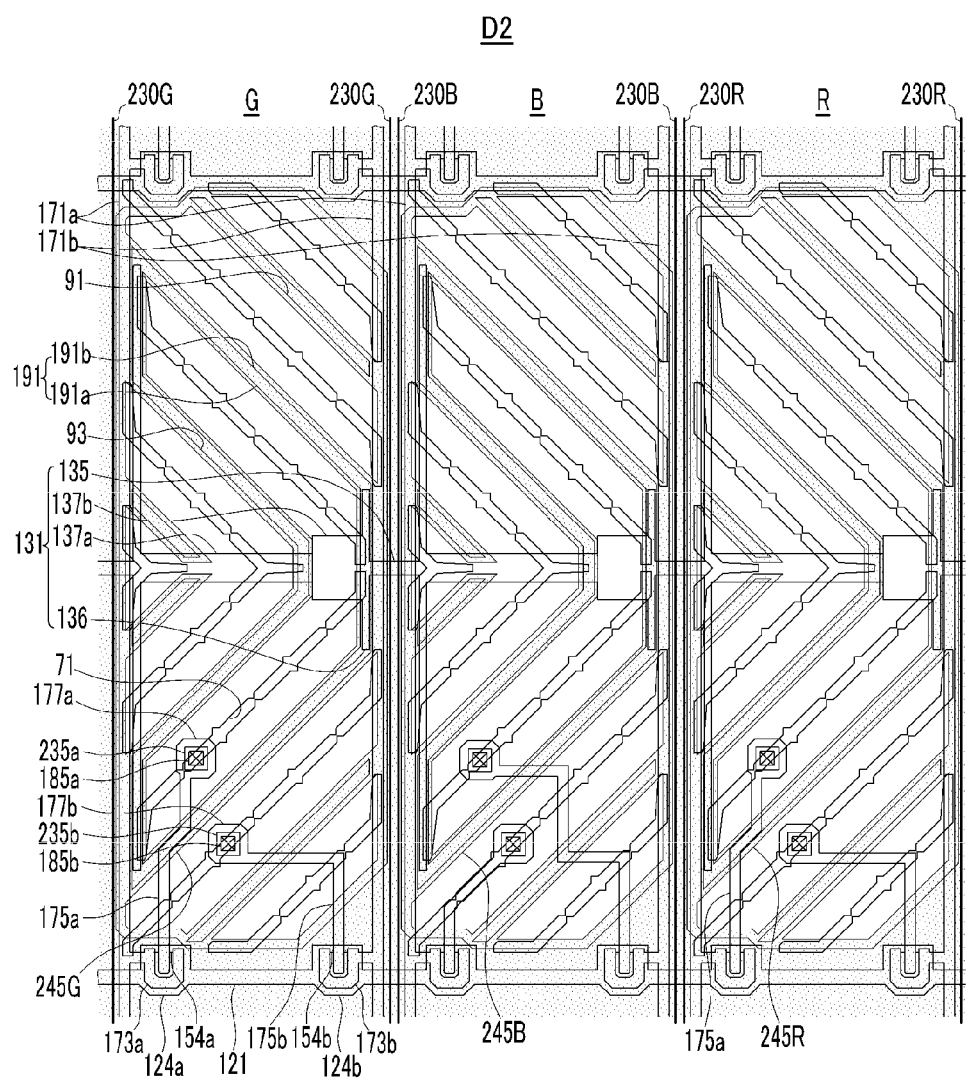
FIG. 8 is a layout view of a liquid crystal display forming the second dot.

FIG. 8 is a layout view of a liquid crystal display forming the second dot. FIG. 9 is a view showing a dot arrangement for a liquid crystal display in which the first dot of FIG. 1 and the second dot of FIG. 8 are intermixed.

As shown in FIG. 8, the structure of the second dot is almost the same as the structure of the first dot shown in FIG. 1 to FIG. 5.

However, the capping layer 240 formed in the second dot is different from the capping layer 240 shown in FIG. 1 to FIG. 5. Capping layer 240 formed in the second dot has a first opening 245G in the green color filter 230G, thereby enclosing the through holes 235a and 235b of the green color filter 230G and exposing the portion of the green color filter 230G. which. Accordingly, the first opening 245G of the capping layer 240 in FIG. 8 is larger than the through holes 235a and 235b of the green color filter 230G.

Figure 9:
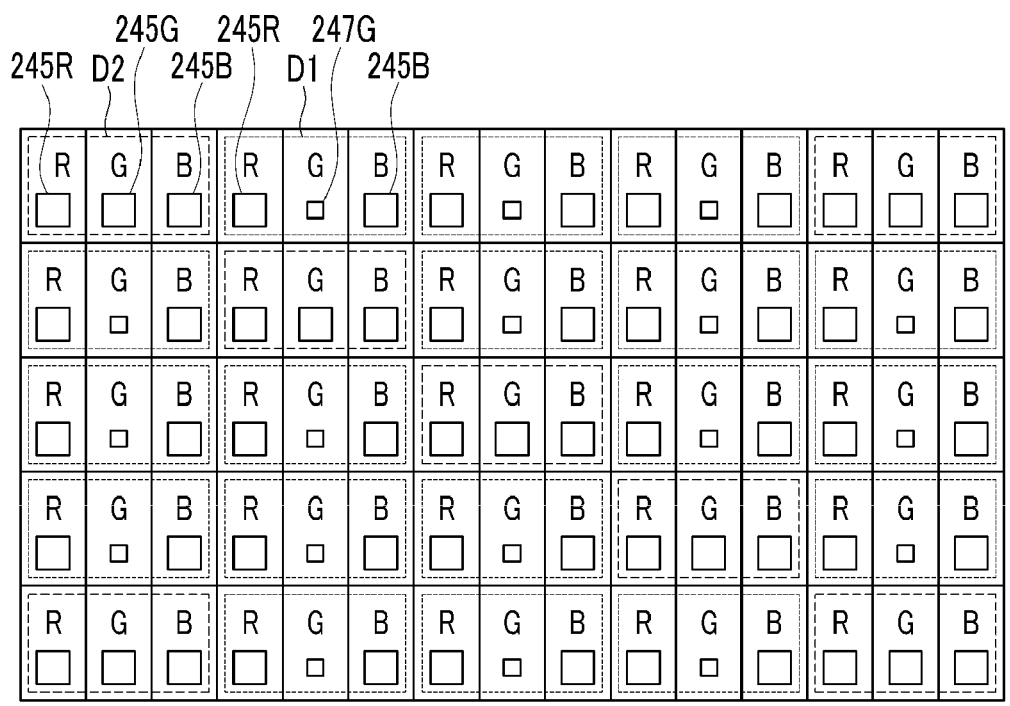
FIG. 9 is a view showing a dot arrangement for a liquid crystal display in which the first dot of FIG. 1 and the second dot of FIG. 8 are intermixed.

Also, as shown in FIG. 9, a combination of first dots D1, which have the structure in which the capping layer 240 exposes the portion of the red color filter 230R and the blue color filter 230B and completely covers the green color filter 230G, and second dots D2, which have the structure in which the capping layer 240 exposes the portion of the red color filter 230R, the blue color filter 230B, and the green color filter 230G, are arranged on the substrate. In FIG. 9, the color filters 230R, 230G, and 230B are extended and aligned sequentially in the row direction.

In the first pixel row of FIG. 9, there is a first second dot D2. Three first dots D1 are then sequentially disposed in the row direction, and the second second dot D2 is disposed on the right side of the three first dots D1. Thus, three first dots D1 and one second dot D2 alternate in the row direction. Also, three first dots D1 are sequentially disposed in the column direction, and the second second dot D2 is disposed under the first dots D1. Thus, three first dots D1 and one second dot D2 alternate in the column direction. Accordingly, the first dot D1 and the second dot D2 are disposed with a ratio of 3:1.

Typically, the ratio of the exposed area of the green color filter 230G exposed through the first opening 245G of the capping layer 240 formed on the green color filter 230G to the entire area of the red color filter 230R, the green color filter 230G, and the blue color filter 230B is in the range of 0.001:1 to 0.003:1. When the ratio of the exposed area of the green color filter 230G to the entire area of the red color filter 230R, the green color filter 230G, and the blue color filter 230B is less than 0.001:1, stress is generated in the capping layer 240 such that the AUA deteriorates. When the ratio of the exposed area of the green color filter 230G to the entire area of the green color filter 230G is larger than 0.003:1, the change of the color coordinate as a result of damage of the green color filter 230G becomes significant.

In the exemplary embodiment, the first dot D1 and the second dot D2 are disposed with the ratio of 3:1, however the first dot D1 and the second dot D2 may be disposed with the ratio of 3:1 to 10:1, and the exposed area of the green color filter 230G may be controlled such that the ratio of the exposed area of the green color filter 230G to the entire area of the red color filter 230R, the green color filter 230G, and the blue color filter 230B may be 0.001:1 to 0.003:1.

In the exemplary embodiment shown in FIG. 9, a combination of first dots D1, which have the structure in which the capping layer 240 exposes a portion of the red color filter 230R and the blue color filter 230B and completely covers the green color filter 230G, and second dots D2, which have the structure in which the capping layer 240 exposes a portion of the red color filter 230R, the blue color filter 230B, and the green color filter 230G, are arranged to form the liquid crystal display. However, a third dot D3, which has a structure in which the capping layer 240 completely covers the red color filter 230R, the blue color filter 230B, and the green color filter 230G may be included in the display in addition to the first dot D1 and the second dot D2.

Next, a liquid crystal display in which a combination of first dots, second dots, and third dots are arranged to form the display will be described with reference to FIG. 10 to FIG. 12.

Figure 10:
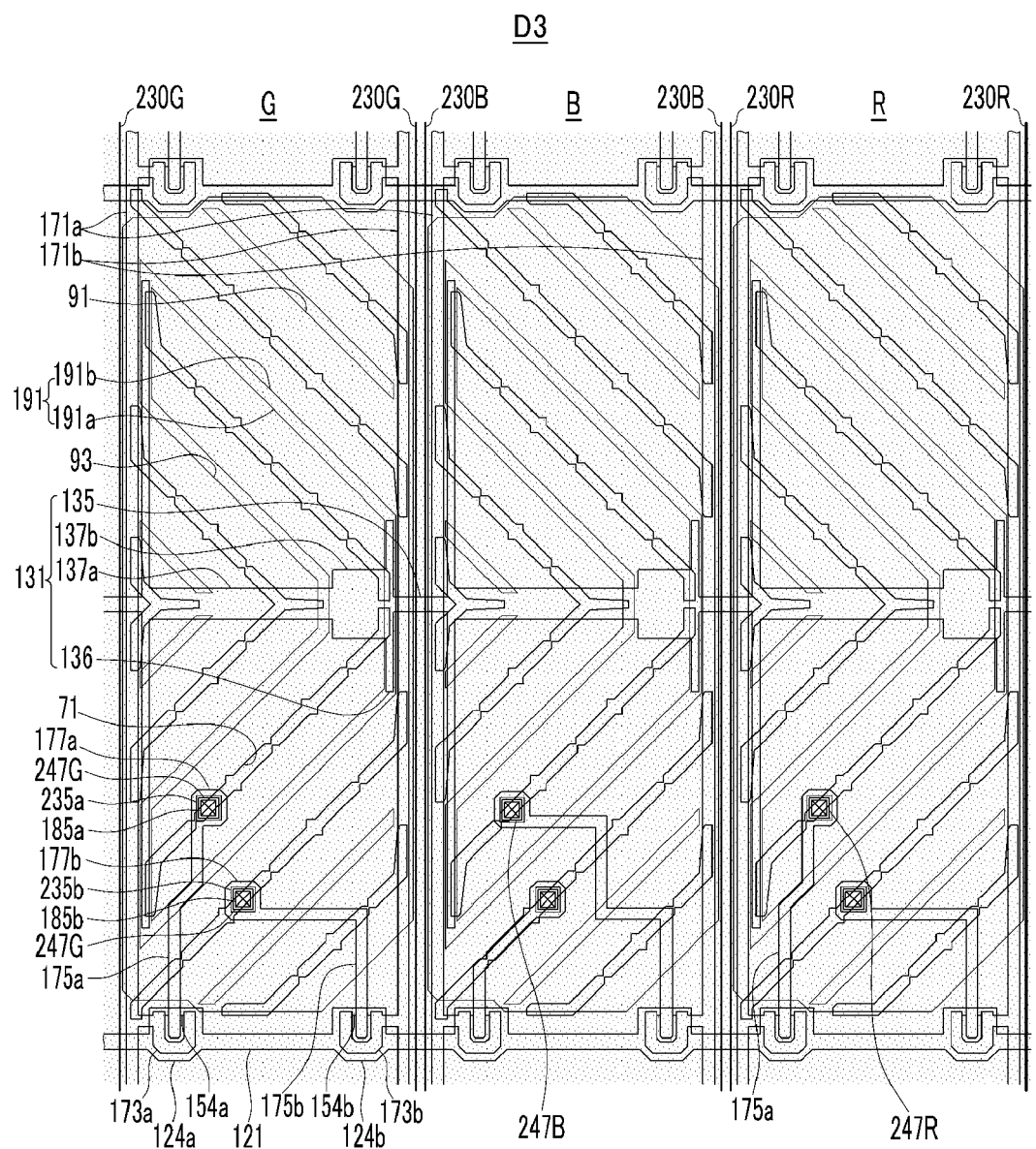
FIG. 10 is a layout view of a liquid crystal display forming the third dot.

FIG. 10 is a layout view of a liquid crystal display forming the third dot. FIG. 11 is a layout view of a liquid crystal display forming the first dot in which an area of a wide end portion of a drain electrode of a pixel where a capping layer covers a color filter is less than an area of a wide end portion of a drain electrode of a pixel where a capping layer exposes a color filter. FIG. 12 is a view showing a liquid crystal display that has a dot arrangement in which the first dot of FIG. 11, the second dot of FIG. 8, and the third dot of FIG. 10 are intermixed.

As shown in FIG. 10, the structure of the third dot of the liquid crystal display is almost the same as the structure of the second dot shown in FIG. 8.

However, the capping layer 240 formed in the third dot D3 of FIG. 10 is different from the capping layer 240 shown in FIG. 8. The capping layer 240 in the third dot D3 has second openings 247R, 247G, and 247B inside the through holes 235a and 235b of the red color filter 230R, the green color filter 230G, and the blue color filter 230B, respectively. Accordingly, the capping layer 240 completely covers the red color filter 230R, the green color filter 230G, and the blue color filter 230B such that the red color filter 230R, the green color filter 230G, and the blue color filter 230B are not exposed. Accordingly, the red color filter 230R, the green color filter 230G, and the blue color filter 230B are not damaged in the etching process of the third dot D3 such that the third dot D3 only slightly influences the slight change of the color coordinate.

Here, the area of the wide end portions 177a and 177b of the drain electrodes of each pixel forming the third dot D3 is smaller than the area of the wide end portions 177a and 177b of the drain electrodes of each pixel forming the second dot D2. In detail, the area of the wide end portions 177a and 177b of the drain electrodes of the pixel where the capping layer 240 completely covers the color filters 230R, 230G, and 230B is smaller than the area of the wide end portions 177a and 177b of the drain electrodes of the pixel where the capping layer 240 exposes the portion of the color filters 230R, 230G, and 230B. Accordingly, the aperture ratio of the pixel where the capping layer 240 completely covers the color filters 230R, 230G, and 230B may be improved.

Figure 11:
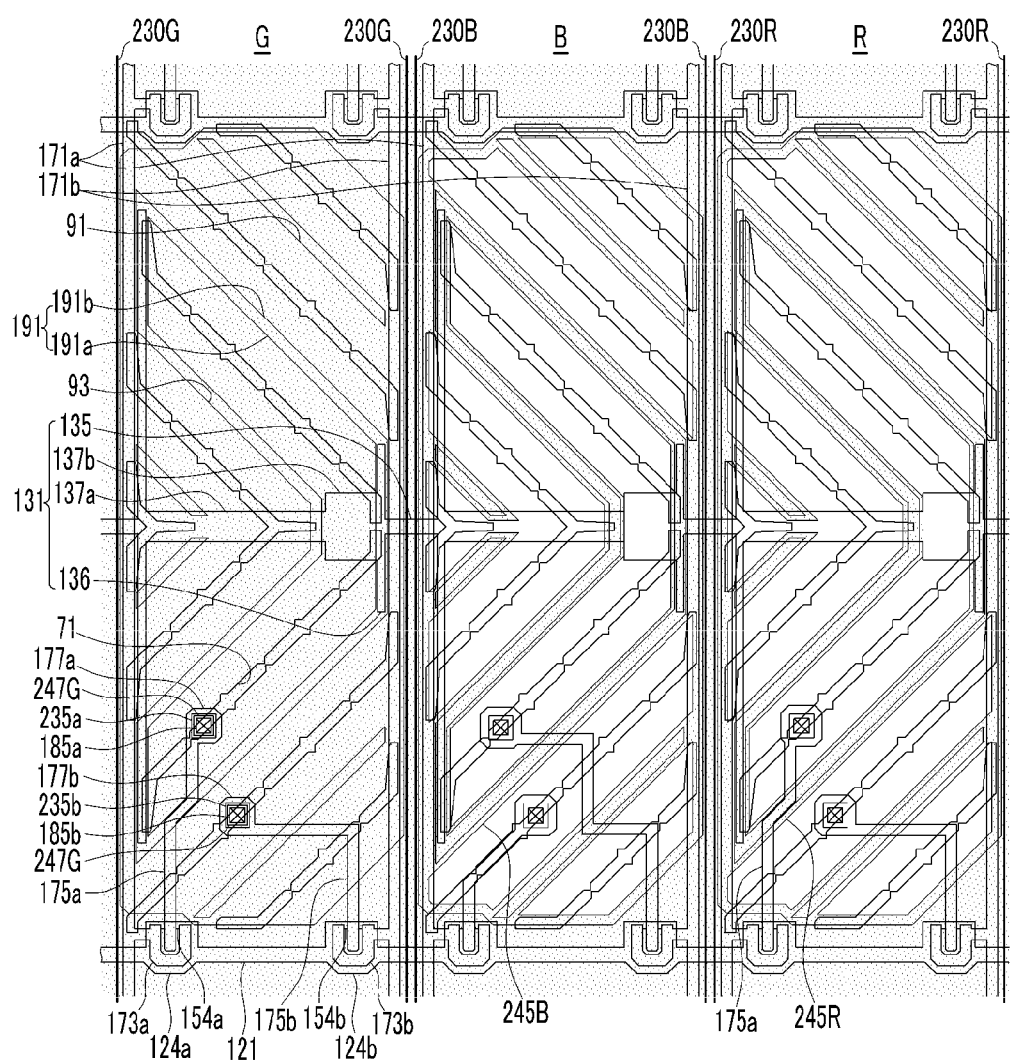
FIG. 11 is a layout view of a liquid crystal display forming the first dot in which an area of a wide end portion of a drain electrode of a pixel where a capping layer covers a color filter is less than an area of a wide end portion of a drain electrode of a pixel where a capping layer exposes a color filter.

Also, as shown in FIG. 11, the area of the wide end portions 177a and 177b of the drain electrode of the pixel G where the capping layer 240 formed in the first dot completely covers the color filters 230G is smaller than the area of the wide end portions 177a and 177b of the drain electrode of the pixels R and B where the capping layer 240 exposes the color filters 230R and 230B. Accordingly, the aperture ratio of the pixel G where the capping layer 240 completely covers the color filters 230G may be improved.

Figure 12:
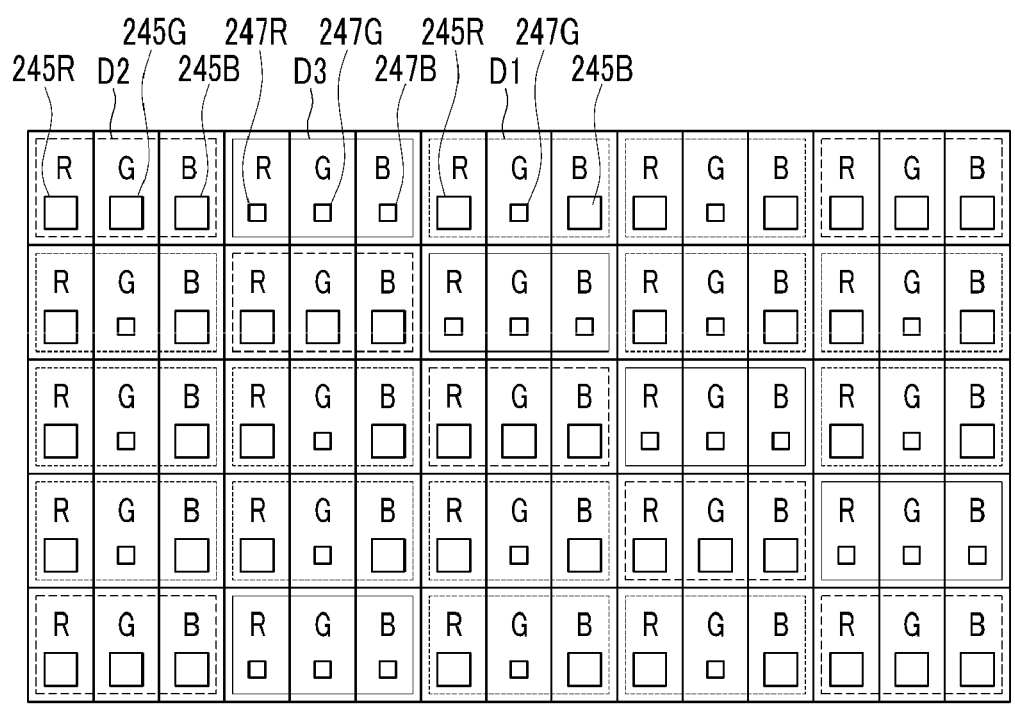
FIG. 12 is a view showing a dot arrangement for a liquid crystal display in which the first dot of FIG. 11, the second dot of FIG. 8, and the third dot of FIG. 10 are intermixed.

As shown in FIG. 12, the first dot D1 where the capping layer 240 exposes the portion of the red color filter 230R and the blue color filter 230B, and completely covers the green color filter 230G, the second dot D2 where the capping layer 240 exposes a portion of the red color filter 230R, the blue color filter 230B, and the green color filter 230G, and the third dot D3 where the capping layer 240 completely covers the red color filter 230R, the blue color filter 230B, and the green color filter 230G, are combined on the display. In this case, the color filters 230R, 230G, and 230B are extended and aligned sequentially in the row direction.

The dot arrangement of FIG. 12 has an arrangement in which a third dot D3 replaces one of the three first dots D1, in this case the first of the three first dots D1, that alternate with the second dots D2 in each row of the dot arrangement shown in FIG. 9. Typically, the area of the green color filter 230G exposed through the first opening 245G is minimized, and the ratio of the exposed area of the green color filter 230G exposed through the first opening 245G of the capping layer 240 formed on the green color filter 230G to the entire area of the red color filter 230R, the green color filter 230G, and the blue color filter 230B is 0.001:1 to 0.003:1. When the ratio of the exposed area of the green color filter 230G to the entire area of the red color filter 230R, the green color filter 230G, and the blue color filter 230B is less than 0.001:1, the stress is generated in the capping layer 240 such that the AUA deteriorates. When the ratio of the exposed area of the green color filter 230G to the entire area of the red color filter 230R, the green color filter 230G, and the blue color filter 230B is larger than 0.003:1, the change of the color coordinate caused by the damage to the green color filter 230G becomes significant.

The number of first dots D1, second dots D2, and third dots D3 is controlled, and the exposed area of the green color filter 230G is controlled, such that the ratio of the exposed area of the green color filter 230G to the entire area of the red color filter 230R, the green color filter 230G, and the blue color filter 230B is 0.001:1 to 0.003:1.

On the other hand, it is possible to form a structure in which the pixel electrode 191 is divided into the first sub-pixel electrode 191a, which is applied with the high voltage, and the second sub-pixel electrode 191b, which is applied with the low voltage, and the capping layer 240 formed corresponding to the first sub-pixel electrode 191a completely covers the color filter, while the capping layer 240 formed corresponding to the second sub-pixel electrode 191b exposes the portion of the color filter.

Next, a liquid crystal display having a fourth dot and a fifth dot of the structure in which the capping layer formed corresponding to the first sub-pixel electrode applied with the high voltage completely covers the color filter and the capping layer corresponding to the second sub-pixel electrode applied with the low voltage exposes the portion of the color filter will be described with reference to FIG. 13 to FIG. 15.

Figure 13:
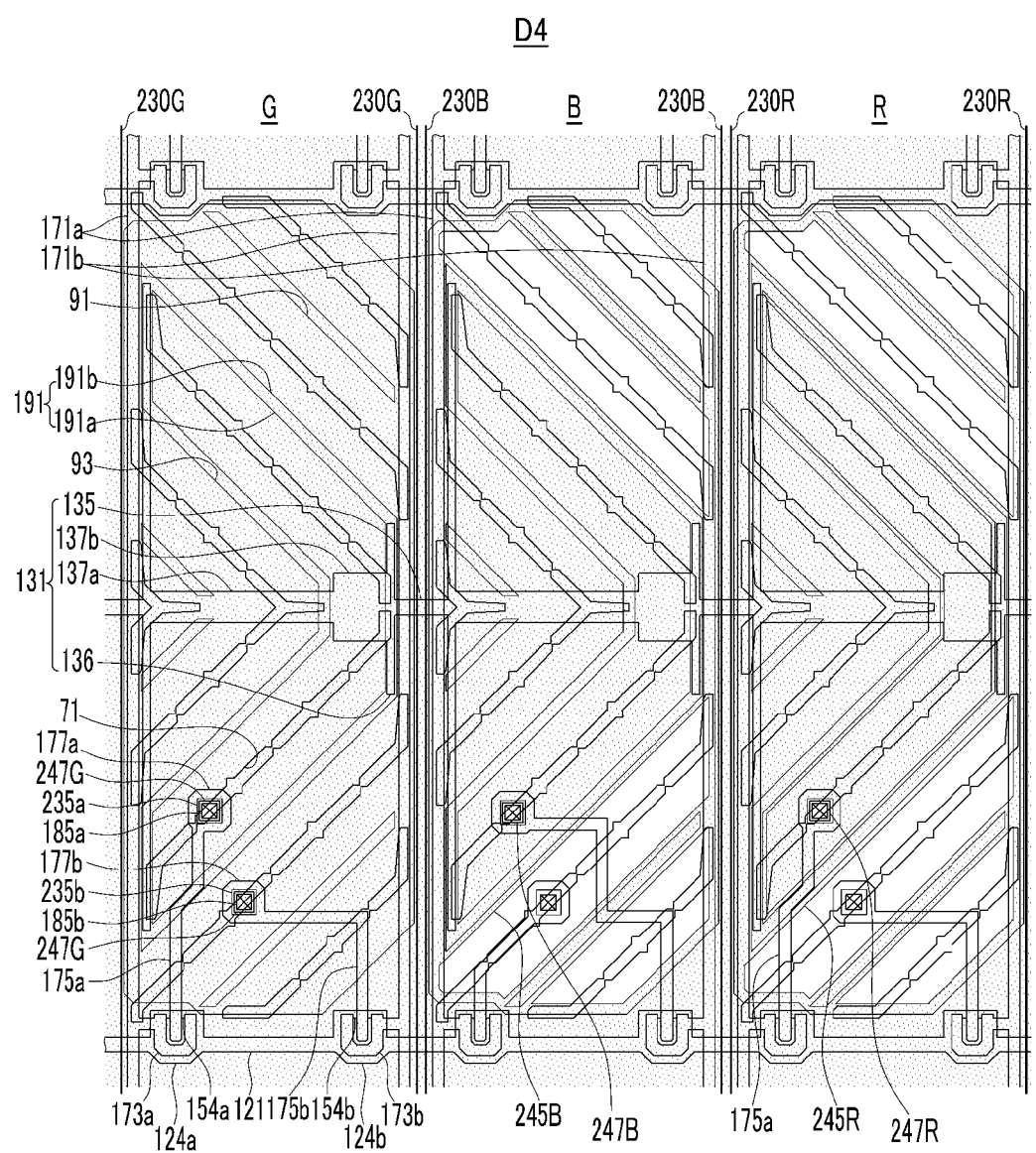
FIG. 13 is a layout view of a liquid crystal display forming the fourth dot.

FIG. 13 is a layout view of a liquid crystal display of the fourth dot. FIG. 14 is a layout view of a liquid crystal display of the fifth dot. FIG. 15 is a view showing a dot arrangement of a liquid crystal display in which the fourth dot of FIG. 13 and the fifth dot of FIG. 14 are intermixed.

As shown in FIG. 13, the structure of the liquid crystal display forming the fourth dot D4 is almost the same as that of the first dot D1 shown in FIG. 1.

However, the capping layer 240 of the fourth dot D4 is different from the capping layer 240 shown in FIG. 1. In the capping layer 240 of the fourth dot D4, the capping layer 240 corresponding to the first sub-pixel electrode 191a completely covers the color filters 230R and 230B in the red pixel R and the blue pixel B, respectively, such that it has the second openings 247R and 247B inside the through holes 235a and 235b of the color filters 230R and 230B. The capping layer 240 corresponding to the second sub-pixel electrode 191b in the fourth dot D4 has the first openings 245R and 245B exposing the portion of the color filters 230R and 230B.

The first sub-pixel electrode 191a that is applied with the high voltage has a large influence on a pixel of a low gray level, i.e. a gray scale level of less than 25. On the other hand, the second sub-pixel electrode 191b that is applied with the low voltage does not have a large influence on a pixel of a low gray level (less than 250).

Accordingly, in the fourth dot D4 shown in FIG. 13, the portions of the color filters 230R, 230G, and 230B corresponding to the first sub-pixel electrode 191a receiving the large influence in the low gray is not exposed, such that they are not damaged in the etching process. Accordingly, the slight change of the color coordinate may be prevented.

Figure 14:
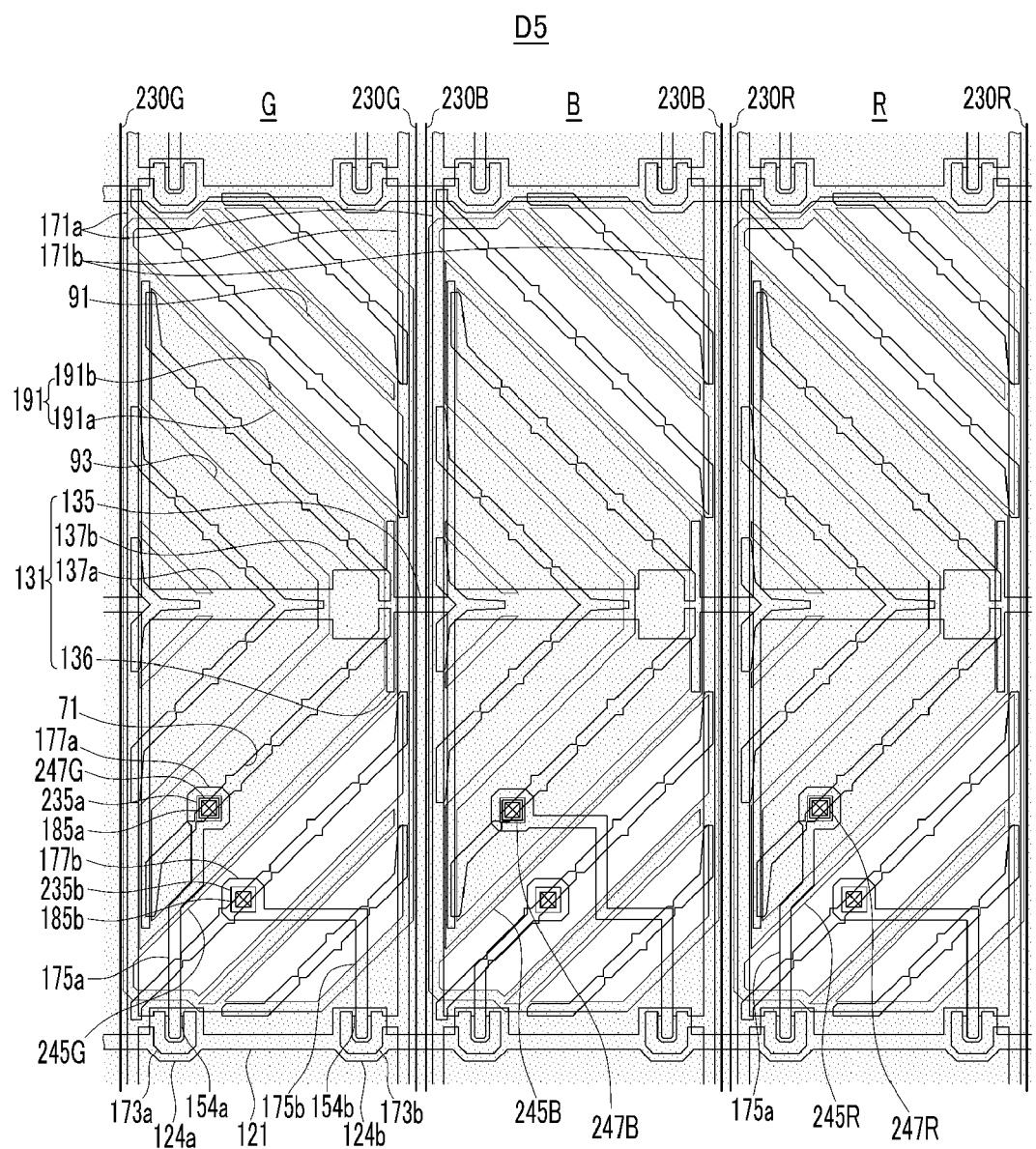
FIG. 14 is a layout view of a liquid crystal display forming the fifth dot.

As shown in FIG. 14, the structure of the liquid crystal display forming the fifth dot D5 is almost the same as that of the second dot D2 shown in FIG. 8.

However, the capping layer 240 formed in the fifth dot is different from the capping layer 240 shown in FIG. 8. In the capping layer 240 formed in the fifth dot D5, the capping layer 240 corresponding to the first sub-pixel electrode 191a completely covers the color filters 230R, 230G, and 230B in the red pixel R, the green pixel G, and the blue pixel B, such that the capping layer 240 has the second openings 247R, 247G, and 247B inside the through holes 235a and 235b of the color filters 230R, 230G, and 230B, and the capping layer 240 corresponding to the second sub-pixel electrode 191b has the first openings 245R, 247G, and 245B exposing to the portion of the color filters 230R, 230G, and 230B.

Figure 15:
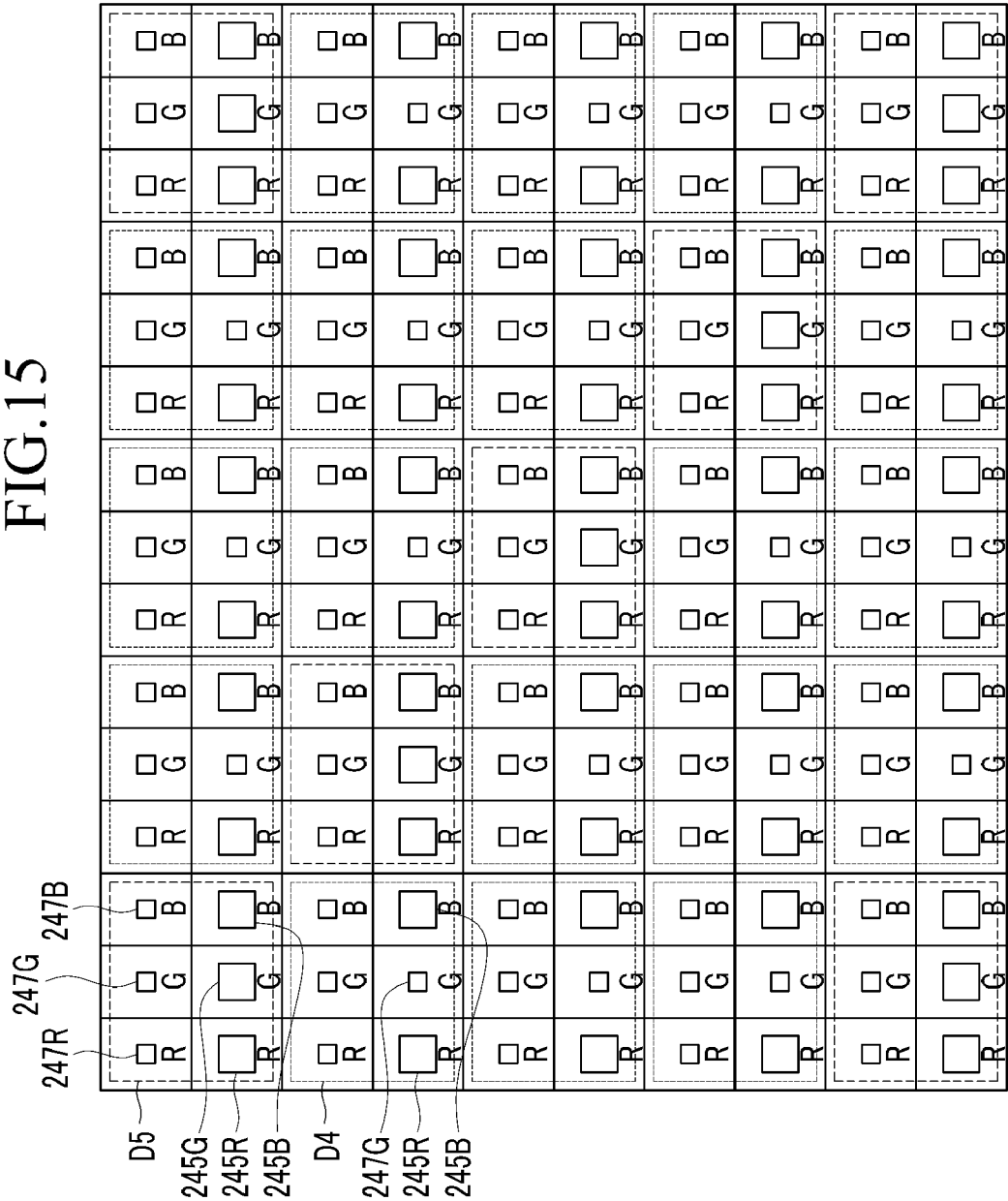
FIG. 15 is a view showing a dot arrangement for a liquid crystal display in which the fourth dot of FIG. 13 and the fifth dot of FIG. 14 are intermixed.

FIG. 15 is a view showing a dot arrangement for a liquid crystal display in which the fourth dot of FIG. 13 and the fifth dot of FIG. 14 are intermixed.

As shown in FIG. 15, the fourth dot D4 and the fifth dot D5 are mixed. In detail, after a first fifth dot D5, three fourth dots D4 are sequentially disposed in the row direction, and the fifth dot D5 is disposed on the right side of the fourth dot D4. Also, three fourth dots D4 are sequentially disposed in the column direction, and the fifth dot D5 is disposed under the fourth dot D4. Accordingly, the fourth dot D4 and the fifth dot D5 are disposed with the ratio of 3:1.

Typically, the ratio of the exposed area of the green color filter 230G exposed through the first opening 245G of the capping layer 240 formed on the green color filter 230G to the entire area of the red color filter 230R, the green color filter 230G, and the blue color filter 230B is 0.001:1 to 0.003:1. When the ratio of exposed area of the green color filter 230G to the entire area of the red color filter 230R, the green color filter 230G, and the blue color filter 230B is less than 0.001:1, stress is generated in the capping layer 240 such that the AUA deteriorates. When the ratio of the exposed area of the green color filter 230G to the entire area of the red color filter 230R, the green color filter 230G, and the blue color filter 230B is larger than 0.003:1, the slight change of the color coordinate caused by damage to the green color filter 230G becomes significant.

In the exemplary embodiment, the fourth dot D4 and the fifth dot D5 are disposed with the ratio of 3:1, however the fourth dot D4 and the fifth dot D5 may be disposed with the ratio of 3:1 to 10:1, and the exposed area of the green color filter 230G may be controlled so that the ratio of the exposed area of the green color filter 230G and the entire area of the red color filter 230R, the green color filter 230G, and the blue color filter 230B is 0.001:1 to 0.003:1.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A thin film transistor array panel comprising:
a substrate;
a thin film transistor formed on the substrate;
a first color filter and a second color filter formed on the thin film transistor and the first and second color filters each having a through hole;
a capping layer formed on the first color filter and the second color filter; and
a pixel electrode formed on the capping layer and connected to the thin film transistor through the through hole,
wherein the capping layer formed on the first color filter has a first opening exposing the through hole of the first color filter, the size of the first opening is larger than the size of the through hole,
the capping layer formed on the second color filter has a second opening disposed inside the through hole of the second color filter, and the size of the second opening is smaller than the size of the through hole.

2. The thin film transistor array panel of claim 1, wherein the first color filter includes a red color filter and a blue color filter, and the second color filter includes a green color filter.

3. The thin film transistor array panel of claim 2, wherein the first opening of the capping layer formed on the red color filter and the blue color filter exposes the red color filter and the blue color filter near the through hole.

4. The thin film transistor array panel of claim 3, wherein the second opening of the capping layer formed on the green color filter is smaller than the first opening of the capping layer formed on the red color filter and the blue color filter.

5. The thin film transistor array panel of claim 4, wherein the first opening of the capping layer formed on the red color filter and the blue color filter overlaps a cutout formed in the pixel electrode.

6. A liquid crystal display comprising:
a thin film transistor;
a color filter formed on the thin film transistor and having a through hole;
a capping layer formed on the color filter;
a pixel electrode formed on the capping layer and connected to the thin film transistor through the through hole;
a common electrode facing the pixel electrode; and
a liquid crystal layer interposed between the pixel electrode and the common electrode,
wherein the color filter includes a red color filter, a green color filter, and a blue color filter,
a first opening of the capping layer formed on the red color filter and the blue color filter encloses a through hole of the red color filter and the blue color filter,
a second opening of the capping layer formed on the green color filter is formed inside a through hole of the green color filter, and
a central part of the first opening of the capping layer formed on the red color filter and the blue color filter corresponds to a central part of a cutout of the common electrode.

7. A thin film transistor array panel comprising:
a substrate;
a thin film transistor formed on the substrate;
a first color filter and a second color filter formed on the thin film transistor and the first and second color filters each having a through hole;
a capping layer formed on the first color filter and the second color filter and having an opening; and
a pixel electrode formed on the capping layer and connected to the thin film transistor through the through hole,
wherein the capping layer exposes the portion of the first color filter near the opening, the capping layer completely covers the second color filter, and
a combination of first color filters and the second color filters are arranged on the substrate.

8. The thin film transistor array panel of claim 7, wherein the first color filter includes a red color filter and a blue color filter, and the second color filter includes a green color filter.

9. The thin film transistor array panel of claim 8, wherein:
the capping layer formed on the red color filter and blue color filter has a first opening that is larger than the through hole; and
the capping layer formed on the green color filter covers the green color filter near the through hole of the green color filter, and has a second opening disposed inside the through hole of the green color filter.

10. The thin film transistor array panel of claim 7, wherein the first color filter includes a red color filter, a green color filter, and a blue color filter, and the second color filter includes a green color filter.

11. The thin film transistor array panel of claim 10, wherein a ration of an exposed area of the green color filter exposed through the first opening of the capping layer formed on the green color filter to the entire area of the red color filter, the green color filter, and the blue color filter has a range of 0.001:1 to 0.003:1.

12. The thin film transistor array panel of claim 10, wherein the pixel electrode includes a first sub-pixel electrode and a second sub-pixel electrode separated from each other via a gap interposed therebetween, and
the voltage of the first sub-pixel electrode is higher than the voltage of the second sub-pixel electrode.

13. The thin film transistor array panel of claim 12, wherein
the capping layer corresponding to the first sub-pixel electrode covers the color filter near the through hole and has a second opening positioned inside the through hole of the color filter, and
the capping layer corresponding to the second sub-pixel electrode has a first opening that is larger than the through hole of the color filter.

14. The thin film transistor array panel of claim 13, wherein
the thin film transistor is connected to the pixel electrode through an end portion of the drain electrode, and
the end portion of the drain electrode of the thin film transistor contacted with the pixel electrode through the second opening is smaller than the end portion of the drain electrode of the thin film transistor contacted with the pixel electrode through the first opening.

15. The thin film transistor array panel of claim 14, wherein
a ratio of an exposed area of the green color filter exposed through the first opening of the capping layer formed on the green color filter, to the entire area of the red color filter, the green color filter, and the blue color filter, has a range of 0.001:1 to 0.003:1.

16. A thin film transistor array panel comprising:
a substrate; and
a plurality of dots formed on the substrate, each dot including a red pixel, a green pixel, and a blue pixel,
wherein the red pixel, the green pixel, and the blue pixel respectively include a thin film transistor formed on the substrate;
a red color filter, a green color filter, and a blue color filter formed on the thin film transistor and having a through hole;
a capping layer formed on the red color filter, the green color filter, and the blue color filter and having an opening; and
a pixel electrode formed on the capping layer and connected to the thin film transistor through the through hole,
wherein the plurality of dots includes a first dot in which the capping layer exposes a portion of the red color filter and the blue color filter and completely covers the green color filter, and
a second dot in which the capping layer exposes the portion of the red color filter, the blue color filter, and the green color filter, and
a combination of first dots and second dots are disposed on the substrate.

17. The thin film transistor array panel of claim 16, wherein:
the capping layer formed on the red color filter and the blue color filter of the first dot has a first opening exposing the through hole of the red color filter and the blue color filter, and the size of the first opening is larger than the size of the through hole;
the capping layer formed on the green color filter of the first dot covers the green color filter near the through hole of the green color filter, and has a second opening disposed inside the through hole of the green color filter; and
the capping layer formed on the red color filter, the green color filter, and the blue color filter of the second dot has a first opening exposing the through hole of the red color filter, the green color filter, and the blue color filter, and the size of the first opening is larger than the size of the through hole.

18. The thin film transistor array panel of claim 16, wherein the first dot and the second dot are disposed on the substrate with a ratio of 3:1 to 10:1.

19. The thin film transistor array panel of claim 17, wherein
A ration of an exposed area of the green color filter exposed through the first opening of the capping layer formed on the green color filter, to the entire area of the red color filter, the green color filter, and the blue color filter, has a range of 0.001:1 to 0.003:1.

20. The thin film transistor array panel of claim 16, wherein
the plurality of dots further includes a third dot where the capping layer completely covers the red color filter, the blue color filter, and the green color filter, and
a combination of first dots, second dots, and third dot are disposed on the substrate.

21. The thin film transistor array panel of claim 20, wherein:
the capping layer formed on the red color filter and the blue color filter of the first dot has a first opening exposing the through hole of the red color filter and the blue color filter, and the size of the first opening is larger than the size of the through hole;
the capping layer formed on the green color filter of the first dot covers the green color filter near the through hole of the green color filter, and has a second opening disposed inside the through hole of the green color filter;
the capping layer formed on the red color filter, the green color filter, and the blue color filter of the second dot has a first opening exposing the through hole of the red color filter, the green color filter, and the blue color filter, and the size of the first opening is larger than the size of the through hole; and
the capping layer formed on the red color filter, the green color filter, and the blue color filter of the third dot covers the red color filter, the green color filter, and the blue color filter near the through hole of the red color filter, the green color filter, and the blue color filter, and has a second opening disposed inside the through hole of the red color filter, the green color filter, and the blue color filter.

22. The thin film transistor array panel of claim 20, wherein
a ratio of an exposed area of the green color filter exposed through the first opening of the capping layer formed on the green color filter, to the entire area of the red color filter, the green color filter, and the blue color filter, has a range of 0.001:1 to 0.003:1.

23. The thin film transistor array panel of claim 16, wherein:
the pixel electrode includes a first sub-pixel electrode and a second sub-pixel electrode separated from each other via a gap interposed therebetween; and
a voltage of the first sub-pixel electrode is higher than a voltage of the second sub-pixel electrode.

24. The thin film transistor array panel of claim 23, wherein:
the capping layer corresponding to the first sub-pixel electrode covers the color filter near the through hole, and has a second opening disposed inside the through hole of the color filter; and
the capping layer corresponding to the second sub-pixel electrode has a first opening larger than the through hole of the color filter.

25. The thin film transistor array panel of claim 24, wherein:
the thin film transistor is contacted with the pixel electrode through the drain electrode; and
the end portion of the drain electrode of the thin film transistor contacted with the pixel electrode through the second opening is smaller than the end portion of the drain electrode of the thin film transistor contacted with the pixel electrode through the first opening.

26. The thin film transistor array panel of claim 25, wherein a ratio of an exposed area of the green color filter exposed through the first opening of the capping layer formed on the green color filter, to the entire area of the red color filter, the green color filter, and the blue color filter, has a range of 0.001:1 to 0.003:1.

* * * * *